United States Patent
Hwang et al.

(10) Patent No.: US 9,425,837 B1
(45) Date of Patent: Aug. 23, 2016

(54) ADAPTIVE FEED-FORWARD POWER AMPLIFIER LINEARIZATION METHODS USING ADAPTIVE FILTERS

(71) Applicant: QUALCOMM Incorporated, San Diego, CA (US)

(72) Inventors: Insoo Hwang, San Diego, CA (US); Cong Nguyen, San Diego, CA (US); Won-ick Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/866,504

(22) Filed: Sep. 25, 2015

(51) Int. Cl.
  *H03F 1/32* (2006.01)
  *H03F 3/189* (2006.01)
  *H04B 1/04* (2006.01)

(52) U.S. Cl.
  CPC ...... *H04B 1/0475* (2013.01); *H04B 2001/0441* (2013.01)

(58) Field of Classification Search
  CPC . H03F 1/3241; H03F 3/189; H03F 2200/451; H03F 2201/3227; H03F 2201/3233; H03F 1/3247; H03F 1/3258; H03F 3/245; H03F 1/32; H03G 3/3042
  See application file for complete search history.

(56) References Cited

U.S. PATENT DOCUMENTS

| | | | | |
|---|---|---|---|---|
| 8,588,711 B2 * | 11/2013 | Ishikawa | ............... | H03F 1/3247 375/296 |
| 8,818,299 B2 | 8/2014 | Morrison et al. | | |
| 8,848,828 B2 * | 9/2014 | Ashita | ............... | H03F 1/3247 375/254 |
| 8,903,336 B2 * | 12/2014 | Fonden | ............... | 455/114.2 |
| 9,190,963 B2 * | 11/2015 | Omer | ............... | H03F 1/3247 |
| 9,270,231 B2 * | 2/2016 | Utsunomiya | ............... | H03F 1/3247 |
| 9,276,533 B2 * | 3/2016 | Lozhkin | ............... | H03F 3/189 |
| 9,276,799 B2 * | 3/2016 | Utsunomiya | ............... | H04L 27/368 |
| 2014/0327481 A1 * | 11/2014 | Kim | ............... | H03F 1/3247 330/149 |
| 2015/0003260 A1 | 1/2015 | Balraj et al. | | |
| 2015/0012759 A1 | 1/2015 | Mozak et al. | | |
| 2015/0028947 A1 | 1/2015 | Lozhkin | | |
| 2015/0061911 A1 | 3/2015 | Pagnanelli | | |
| 2015/0097618 A1 * | 4/2015 | Lozhkin | ............... | H03G 3/3042 330/149 |
| 2016/0065147 A1 * | 3/2016 | Pratt | ............... | H03F 1/3247 330/75 |
| 2016/0099687 A1 * | 4/2016 | Khlat | ............... | H03F 1/0227 455/127.3 |

* cited by examiner

*Primary Examiner* — Pablo Tran
(74) *Attorney, Agent, or Firm* — Holland & Hart LLP

(57) ABSTRACT

A device may use enhanced power amplifier (PA) linearization techniques such as adaptive feed-forward (FF) linearization using adaptive filters. In one example, an adaptive feed-forward linearizer may isolate a distortion signal based at least in part on the signals input to and output from a PA in a transmission path. The distortion signal may be used to cancel distortion at the output of the PA to produce an improved output signal. A first adaptive circuit may be used to produce the distortion signal and a second adaptive circuit may be used to produce an error cancellation signal based at least in part on the distortion signal. The error cancellation signal may be amplified and re-introduced to the transmission path to produce the improved output signal. Semi-adaptive circuits may be used in place of the adaptive circuits, or a hybrid approach may be used.

30 Claims, 15 Drawing Sheets

ADAPTIVE FEED-FORWARD POWER AMPLIFIER LINEARIZATION METHODS USING ADAPTIVE FILTERS

BACKGROUND

The following relates generally to wireless communications, and more specifically to adaptive feed-forward power amplifier linearization methods using adaptive filters.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may be otherwise known as user equipment (UE).

A wireless device may utilize a power amplifier (PA) to amplify a signal to be wirelessly transmitted. In some cases, PAs may exhibit non-linear behavior, for example during high power transmissions, that produce emissions outside of the desired frequency band, thereby introducing interference in neighboring frequency bands. A device may use PA linearization techniques to reduce the magnitude of out of band emissions. However, conventional methods used to linearize the PA may decrease efficiency of the transmit circuit or fail to accurately remove non-linearity from the transmit signal.

SUMMARY

A device may use enhanced power amplifier (PA) linearization techniques to produce an improved output signal. For example, adaptive feed-forward (FF) linearization techniques may be used with adaptive filters. In one example, an adaptive FF linearizer may isolate a distortion signal based on the signals input to and output from a PA in a transmission path. The distortion signal may be used to cancel distortion at the output of the PA to produce an improved output signal. In some examples, a first adaptive circuit may be used to produce the distortion signal and a second adaptive circuit may be used to produce an error cancellation signal based on the distortion signal. The error cancellation signal may be amplified and re-introduced to the transmission path to produce the improved output signal. The adaptive circuits may be either fully-adaptive or semi-adaptive. For example, semi-adaptive circuits may be used in place of fully-adaptive circuits, or a hybrid approach may be used. The device may produce a control voltage to control the semi-adaptive circuits.

A method of wireless communication is described. The method may include providing a first signal to an input of a PA in a transmission path of a wireless device, reproducing a distortion signal based at least in part on the first signal and an output of the PA, producing a PA output signal with improved linearity by cancelling distortion at the output of the PA using the distortion signal, and using analog adaptive filters to reproduce the distortion signal and to produce an error cancellation signal for producing the improved PA output signal.

An apparatus for wireless communication is described. The apparatus may include means for providing a first signal to an input of a PA in a transmission path of a wireless device, means for reproducing a distortion signal based at least in part on the first signal and an output of the PA, means for producing a PA output signal with improved linearity by cancelling distortion at the output of the PA using the distortion signal, and means for using analog adaptive filters to reproduce the distortion signal and to produce an error cancellation signal for producing the improved PA output signal.

A further apparatus for wireless communication is described. The apparatus may include a PA in a transmission path of a wireless device, the PA having a first signal as an input, a signal cancellation circuit for reproducing a distortion signal based at least in part on the first signal and an output of the PA, an error cancellation circuit for producing a PA output signal with improved linearity by cancelling distortion at the output of the PA using the distortion signal, and wherein the signal cancellation circuit comprises an analog adaptive filter to reproduce the distortion signal, and wherein the error cancellation circuit comprises an analog adaptive filter to produce an error cancellation signal for producing the improved PA output signal.

A non-transitory computer-readable medium storing code for wireless communication is described. The code may include instructions executable to provide a first signal to an input of a PA in a transmission path of a wireless device, reproduce a distortion signal based at least in part on the first signal and an output of the PA, produce a PA output signal with improved linearity by cancelling distortion at the output of the PA using the distortion signal, and use analog adaptive filters to reproduce the distortion signal and to produce an error cancellation signal for producing the improved PA output signal.

Some examples of the method, apparatuses, or non-transitory computer-readable medium described herein may further include processes, features, means, or instructions for autonomously generating a set of coefficients for the analog adaptive filter based at least in part on an output of the analog adaptive filter. Additionally or alternatively, some examples may include processes, features, means, or instructions for using an analog adaptive filter to produce the distortion signal and an analog semi-adaptive filter to produce the error cancellation signal for producing the improved PA output signal, and generating a coefficient for the analog semi-adaptive filter via a control voltage, wherein the control voltage may be adapted in the digital or analog domain.

In some examples of the method, apparatuses, or non-transitory computer-readable medium described herein, the semi-adaptive filter is controlled via a direct current (DC) control voltage. Additionally or alternatively, some examples may include processes, features, means, or instructions for determining the control voltage based at least in part on a steepest descent algorithm or a sign stochastic approximation.

Some examples of the method, apparatuses, or non-transitory computer-readable medium described herein may further include processes, features, means, or instructions for using an analog semi-adaptive filter to produce the distortion signal and an analog adaptive filter to produce the error cancellation signal for producing the improved PA output signal, and generating a coefficient for the analog semi-adaptive filter via a control voltage, wherein the control voltage may be adapted in the digital or analog domain. Additionally or alternatively, some examples may include processes, features, means, or instructions for using analog semi-adaptive filters to produce the distortion signal and to produce the error cancellation signal, and generating a first set of coefficients via a first control voltage for the analog semi-adaptive filter producing the distortion signal and a second set of coefficients via a second control voltage for the analog semi-adaptive filter producing the error cancellation signal, wherein the first control voltage and the second control voltage may be adapted in the digital or analog domain.

In some examples of the method, apparatuses, or non-transitory computer-readable medium described herein, the producing the improved PA output signal comprises amplifying the error cancellation signal to match the amplitude and phase of the error cancellation signal with the distortion at the output of the PA, and introducing the amplified error cancellation signal to the output of the PA. Additionally or alternatively, in some examples the reproducing the distortion signal comprises using an analog adaptive filter to produce the distortion signal based at least in part on the first signal, the output of the PA, and the distortion signal via a signal cancellation circuit.

In some examples of the method, apparatuses, or non-transitory computer-readable medium described herein, the analog adaptive filters are least mean squares (LMS) adaptive filters. Additionally or alternatively, in some examples the producing the improved PA output signal comprises using an analog adaptive filter to produce an error cancellation signal based at least in part on the output of the PA, the distortion signal, and the improved PA output signal via an error cancellation circuit.

Some examples of the method, apparatuses, or non-transitory computer-readable medium described herein may further include processes, features, means, or instructions for providing the distortion signal to an injection point at the wireless device. Additionally or alternatively, in some examples the injection point comprises any of a receiver at the wireless device, another PA at the wireless device, or any combination thereof.

Some examples of the method, apparatuses, or non-transitory computer-readable medium described herein may further include processes, features, means, or instructions for measuring an amount of distortion associated with the distortion signal, and bypassing, based at least in part on the measured distortion, at least one of the producing of the distortion signal or the producing of an error cancellation signal for producing the improved PA output signal. Additionally or alternatively, in some examples the bypassing comprises applying a control voltage that has a net voltage of zero.

Some examples of the methods, apparatuses, or non-transitory computer-readable media described herein may further include processes, features, means, or instructions for adaptive feed-forward linearization using adaptive filters. Further scope of the applicability of the described systems, methods, apparatuses, or computer-readable media will become apparent from the following detailed description, claims, and drawings. The detailed description and specific examples are given by way of illustration only, since various changes and modifications within the scope of the description will become apparent to those skilled in the art.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

DETAILED DESCRIPTION

Figure 1:
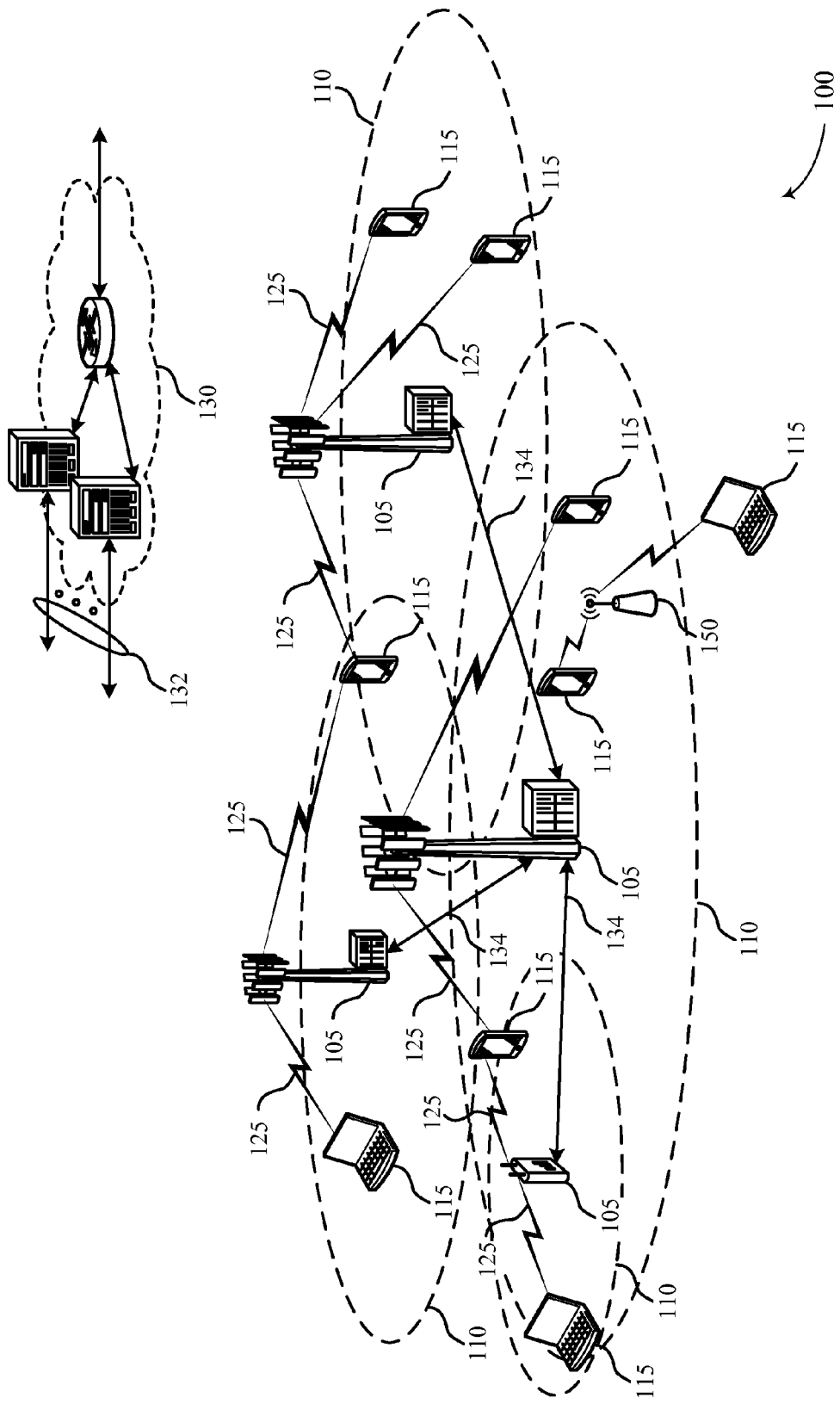
FIG. 1 illustrates an example of a wireless communications system that supports adaptive feed-forward (FF) linearization methods using adaptive filters (including fully- or semi-adaptive filters) in accordance with various aspects of the present disclosure.

According to the present disclosure, enhanced power amplifier (PA) linearization techniques may be used to produce an improved output signal. An enhanced PA linearizer may use adaptive filters with adaptive feed-forward (FF) linearization techniques to linearize an output signal. An adaptive filter may be a filter that includes a transfer function controlled by one or more coefficients or weights, where the coefficients or weights may be adjusted in order to adapt the filter. Thus, an adaptive filter generally includes one or more filter components and implements an adaptation process. An adaptive filter may be an analog adaptive filter or a digital adaptive filter. Analog adaptive filters may be preferred over digital adaptive filters for high speed, low power applications, while digital adaptive filters may be efficiently used for low speed applications. Herein, an analog adaptive filter may refer to an adaptive filter that includes one or more analog filter components, while the adaptation process may be performed using either analog or digital components. A fully-adaptive filter may refer to an adaptive filter whose adaptation process is continuous and autonomous, thereby requiring no outside control. For example, the control coefficients (sometimes referred to as tap weights) may be autonomously generated (e.g., based on closed loop feedback, etc.). A semi-adaptive filter may refer to an adaptive filter whose adaptation process requires some additional outside control or input. For example, the control coefficients (or tap weights) may be generated using at least some outside control or input, including use of a microprocessor programmed to generate the control coefficients (or tap weights), instead of relying solely upon a closed loop feedback system to generate the control coefficients (or tap weights). The outside control or input may result in the semi-adaptive filter adapting non-continuously. Therefore, a semi-adaptive filter is adapted non-continuously. In an example, a semi-adaptive filter may receive direct current (DC) control voltages as tap weights, where the DC control voltages are generated by using a signal processor using inputs or algorithms that are applied on a non-continuous basis.

In some examples of the disclosure, an enhanced PA linearizer may be implemented as an FF linearizer that utilizes analog adaptive filters (e.g., adaptive least mean squares (LMS) circuits). Analog adaptive filters may include analog fully-adaptive filters (e.g., adaptive LMS circuits) and analog semi-adaptive filters (e.g., semi-adaptive LMS circuits), both of which may be used to linearize the PA. A combination of analog fully-adaptive and analog semi-adaptive filters may also be used. Aspects of the disclosure are also described in the context of a wireless communication system. In some examples, a user equipment (UE) may use an enhanced PA linearizer for transmissions to a base station; in other examples, a base station may use the enhanced PA linearizer for transmissions to a UE.

In one example, a PA may be included in a transmission path of a UE. The UE may utilize an FF linearizer to remove non-linearity, such as distortion, from the output of the PA. The FF linearizer may utilize a first analog adaptive filter as a signal cancellation circuit to isolate the distortion components from the output of the PA, thereby generating a distortion signal. The FF linearizer may use another or second analog adaptive filter as an error cancellation circuit. The distorted signal produced by the signal cancellation circuit may be passed to the error cancellation circuit to produce an error cancellation signal, which may be amplified and re-introduced to the transmission path at the PA output in order to remove distortion from the output signal. The signal cancellation circuit and the error cancellation circuit may each be implemented using LMS circuits, which may each include a vector modulator and a vector demodulator. The vector demodulator may determine weights for the vector modulator based at least in part on the output of the respective circuit (either the signal cancellation circuit or the error cancellation circuit) in which the vector demodulator and vector modulator are used. The FF linearizer may additionally use couplers to couple the distortion signal and the error cancellation signal with various signals output from the PA.

In other examples, the UE may use analog semi-adaptive filters for either the signal cancellation circuit or the error cancellation circuit. The analog semi-adaptive filters may be controlled by a voltage (e.g., a DC voltage) in the form of a tap weight or coefficient that is generated by the UE in either the analog domain or the digital domain. The control voltage may be generated using optimization algorithms, such as steepest descent algorithms, which may use as inputs the improved output of the PA and, in some cases, the signal input to the PA. In some cases, the control voltages may be set to a voltage (e.g., 0) that enables bypassing of the analog semi-adaptive filters. These and other aspects of the disclosure are further illustrated by and described with reference to apparatus diagrams, system diagrams, and flowcharts.

FIG. 1 illustrates an example of a wireless communications system 100 that supports adaptive FF linearization using adaptive filters in accordance with various aspects of the present disclosure. The wireless communications system 100 includes base stations 105, UEs 115, and a core network 130. The core network 130 may provide user authentication, access authorization, tracking, Internet Protocol (IP) connectivity, and other access, routing, or mobility functions. The base stations 105 interface with the core network 130 through a first set of backhaul links 132 (e.g., S1, etc.) and may perform radio configuration and scheduling for communication with the UEs 115, or may operate under the control of a base station controller. In various examples, the base stations 105 may communicate, either directly or indirectly (e.g., through core network 130), with each other over a second set of backhaul links 134 (e.g., X2, etc.), which may be wired or wireless communication links.

The base stations 105 may wirelessly communicate with the UEs 115 via one or more base station antennas. Each of the base station 105 sites may provide communication coverage for a respective geographic coverage area 110. In some examples, base stations 105 may be referred to as a base transceiver station, a radio base station, an access point, a radio transceiver, a NodeB, evolved NodeB (eNB), Home NodeB, a Home eNodeB, or some other suitable terminology. The wireless communications system 100 may include base stations 105 of different types (e.g., macro and/or small cell base stations). There may be overlapping geographic coverage areas 110 for different technologies.

In some examples, the wireless communications system 100 is a Long Term Evolution (LTE)/LTE-Advanced (LTE-A) network. In LTE/LTE-A networks, the term eNB may be generally used to describe the base stations 105, while the term UE may be generally used to describe the UEs 115. The wireless communications system 100 may be a Heterogeneous LTE/LTE-A network in which different types of eNBs provide coverage for various geographical regions. For example, each eNB or base station 105 may provide communication coverage for a macro cell, a small cell, and/or other types of cell. The term "cell" is a 3rd Generation Partnership Project (3GPP) term that can be used to describe a base station, a carrier or component carrier associated with a base station, or a coverage area (e.g., sector, etc.) of a carrier or base station, depending on context.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell may cover a relatively smaller geographic area and may allow unrestricted access by UEs with service subscriptions with the network provider. A femto cell also may cover a relatively small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB or a home eNB. An eNB may support one or multiple (e.g., two, three, four, and the like) cells (e.g., component carriers).

The wireless communications system 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The communication networks that may accommodate some of the various disclosed examples may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use Hybrid Automatic Repeat Request (HARQ) to provide retransmission at the MAC layer to improve link efficiency. In the control plane, the radio resource control (RRC) protocol layer may provide establishment, configuration, and maintenance of an RRC connection between a UE 115 and the base stations 105 or core network 130 supporting radio bearers for the user plane data. At the Physical (PHY) layer, the transport channels may be mapped to physical channels.

The UEs 115 are dispersed throughout the wireless communications system 100, and each UE 115 may be stationary or mobile. A UE 115 may also include, or be referred to by those skilled in the art, as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with various types of base stations and network equipment including macro eNBs, small cell eNBs, relay base stations, and the like.

The communication links 125 shown in wireless communications system 100 may include uplink (UL) transmissions from a UE 115 to a base station 105, and/or downlink (DL) transmissions, from a base station 105 to a UE 115. The DL transmissions may also be called forward link transmissions while the UL transmissions may also be called reverse link transmissions. Each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using frequency division duplex (FDD) (e.g., using paired spectrum resources) or time division duplex (TDD) operations (e.g., using unpaired spectrum resources). Frame structures for FDD (e.g., frame structure type 1) and TDD (e.g., frame structure type 2) may be defined.

In some embodiments of the wireless communications system 100, base stations 105 and/or UEs 115 may include multiple antennas for employing antenna diversity schemes to improve communication quality and reliability between base stations 105 and UEs 115. Additionally or alternatively, base stations 105 and/or UEs 115 may employ multiple-input, multiple-output (MIMO) techniques that may take advantage of multi-path environments to transmit multiple spatial layers carrying the same or different coded data.

In some examples, the wireless communications system 100 may operate according to a first radio access technology (e.g., a cellular radio access technology, such as an LTE/LTE-A technology), but operate in the presence of one or more networks or nodes operating according to a second radio access technology (e.g., a Wi-Fi technology). By way of example, FIG. 1 shows a network comprised of a Wi-Fi access point (AP) 150 in communication with Wi-Fi stations (STAs), which may also be examples of UEs 115. In some examples, a UE 115 may be equipped with both a Wi-Fi modem and an LTE modem and may communicate with either a base station 105 or an AP 150. LTE transmissions from a UE 115 may interfere with the reception of Wi-Fi signals at the UE 115. The affected Wi-Fi receiver may be referred to as the "victim" receiver, and the UE 115 may fail to decode degraded Wi-Fi communications from an AP 150. In some cases, regulations on LTE transmissions may be followed that reduce leakage (e.g., in the frequency domain) into the Wi-Fi spectrum; however, significant interference may still occur.

A UE 115, base station 105, or an AP 150 may be used to transmit signals using an amplifier to convert a lower-power radio frequency (RF) signal to a higher-power RF signal. As an example, a UE 115 may utilize an amplifier to transmit signals to base station 105 or AP 150. For example, the amplifier may amplify an input signal with a selected gain to increase the transmission range of the UE 115. In some cases, such as high power transmissions, an amplifier may experience linear and non-linear distortions that widen the emission spectrum for a transmission and produce interference in neighboring frequency bands. For instance, the emission spectrum associated with an LTE transmission may interfere with a Wi-Fi band. Amplifiers may additionally experience distortion from amplifier gain drift due to environmental changes, such as variations in the supply voltage, temperature, and aging of components over time. Accordingly, techniques to linearize amplifier operations may be utilized to reduce distortion, and thereby, reduce interference in neighboring frequency bands.

FF power amplification may be one method used to linearize an amplifier. A FF amplifier may be used to subtract the output of the amplifier from the input to isolate the distortion caused by the amplifier. This distortion may then be re-introduced, e.g., with a negative coupling factor, at the amplifier output signal in order to cancel the distortion present in the amplifier output signal and produce an undistorted output signal. The FF amplifier may be implemented using a splitter that divides an input signal between two signal paths, an input path to the amplifier and a reference path, for instance. The input path may be the signal path associated with the signal that is input to the amplifier, and the reference path may be associated with the signal that is used to represent an undistorted input signal. The reference path may also include a delay element that compensates for propagation delays of the input signal through the amplifier. The delay element may include variable attenuation and phase shifting which may be applied to the undistorted input signal in the reference path to create the reference signal. A coupler and fixed attenuator may be used to sample the output of the amplifier and to match the magnitude of the sampled output with the reference signal. The sampled output of the amplifier and the reference signal may then be subtracted from one another to yield a signal representing signal distortion that may be attenuated, phase shifted, amplified, and re-introduced to the amplifier output to produce an undistorted output signal.

The variable attenuation and phase shifting may also be referred to as a complex gain adjuster and may be used to adapt the magnitude and phase of the input signal to the amplifier. A complex gain adjuster may be implemented as a vector modulator that multiplies the in-phase and quadrature components of a signal by a determined value. The complex gain may be adjusted based at least in part on power minimization techniques or gradient signals. Power minimization may deliberately perturb the input signal to update the weights used by the complex gain adjuster. Alternatively, a device may continually compute estimates of the gradient of a 3-dimensional power surface to determine weights of the complex gain adjuster. Although the above-mentioned FF techniques may be used to linearize an amplifier, power minimization and gradient computation techniques using components such as a splitter may decrease efficiency and lose accuracy over time (due to temperature, aging, etc.). For instance, the use of the splitter may result in substantial loss (e.g., −3 dB), and additionally, the adaptation techniques used to match the phase and magnitude of the amplifier may be inaccurate. Furthermore, the adaptation may be applied to the input signal prior to the amplifier and, therefore, may affect the input signal itself.

Figure 2A:
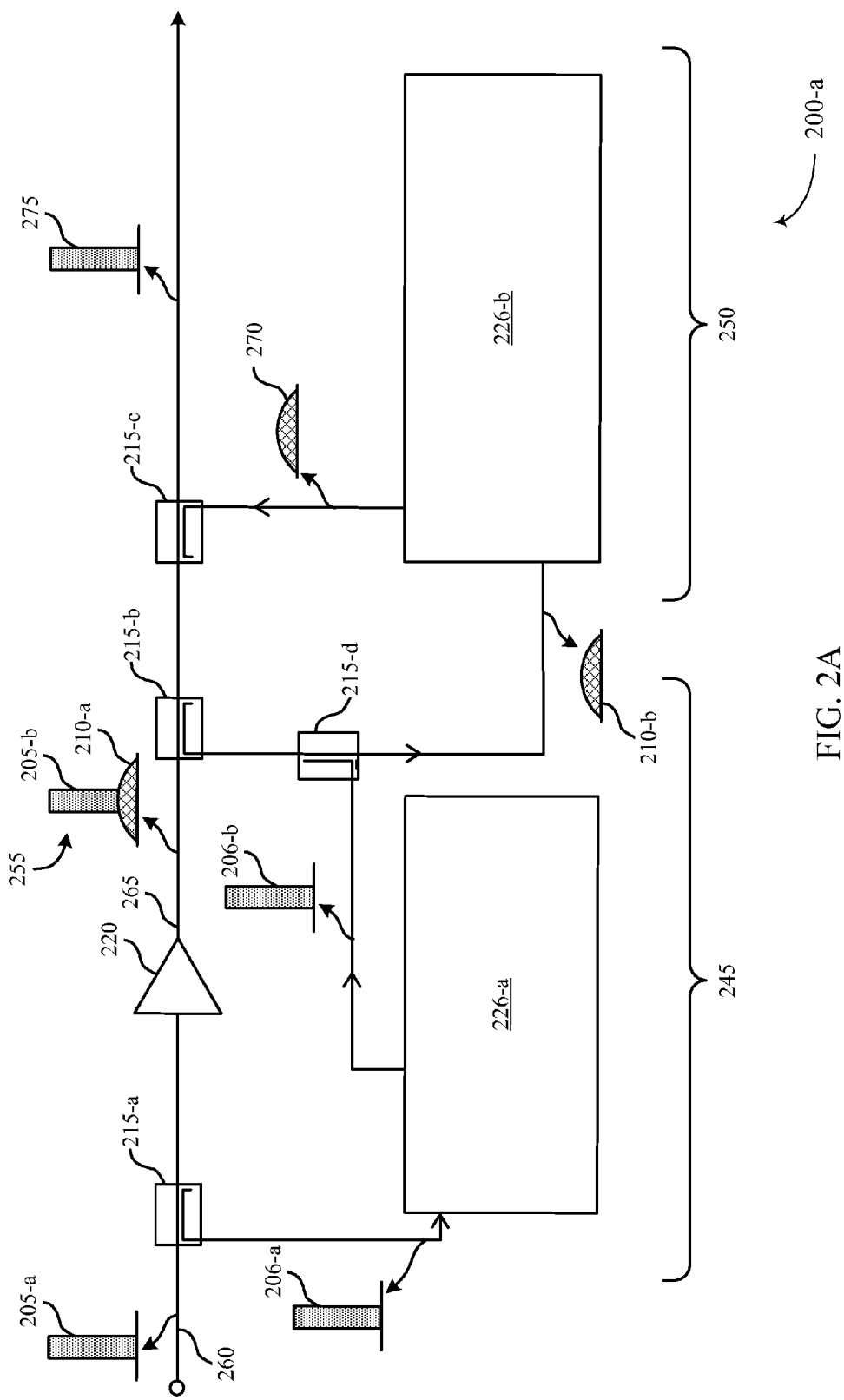
FIGS. 2A, 2B, 3, and 4 illustrate examples of FF linearizers for adaptive FF linearization methods using adaptive filters in accordance with various aspects of the present disclosure.
Figure 2B:
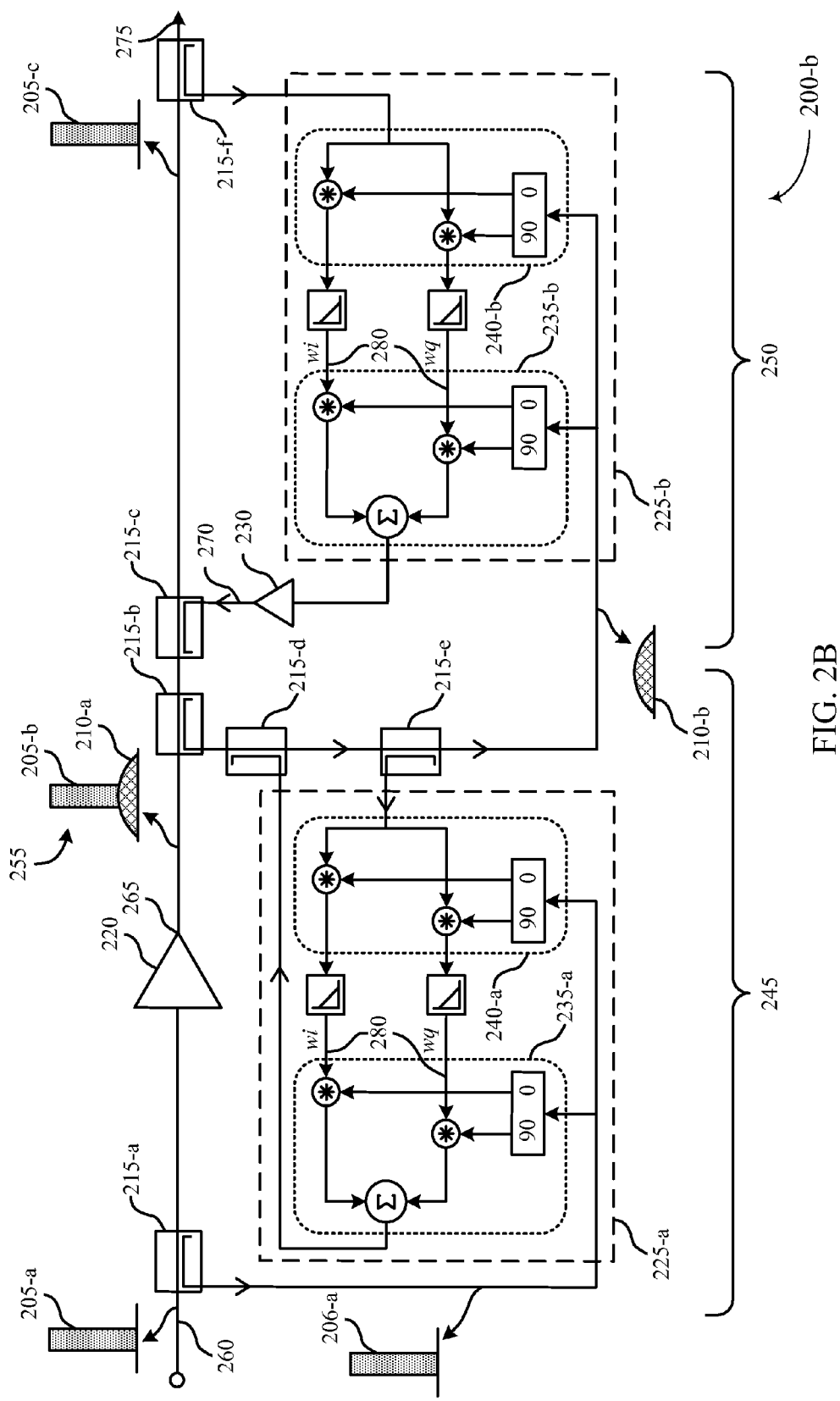
Figure 3:
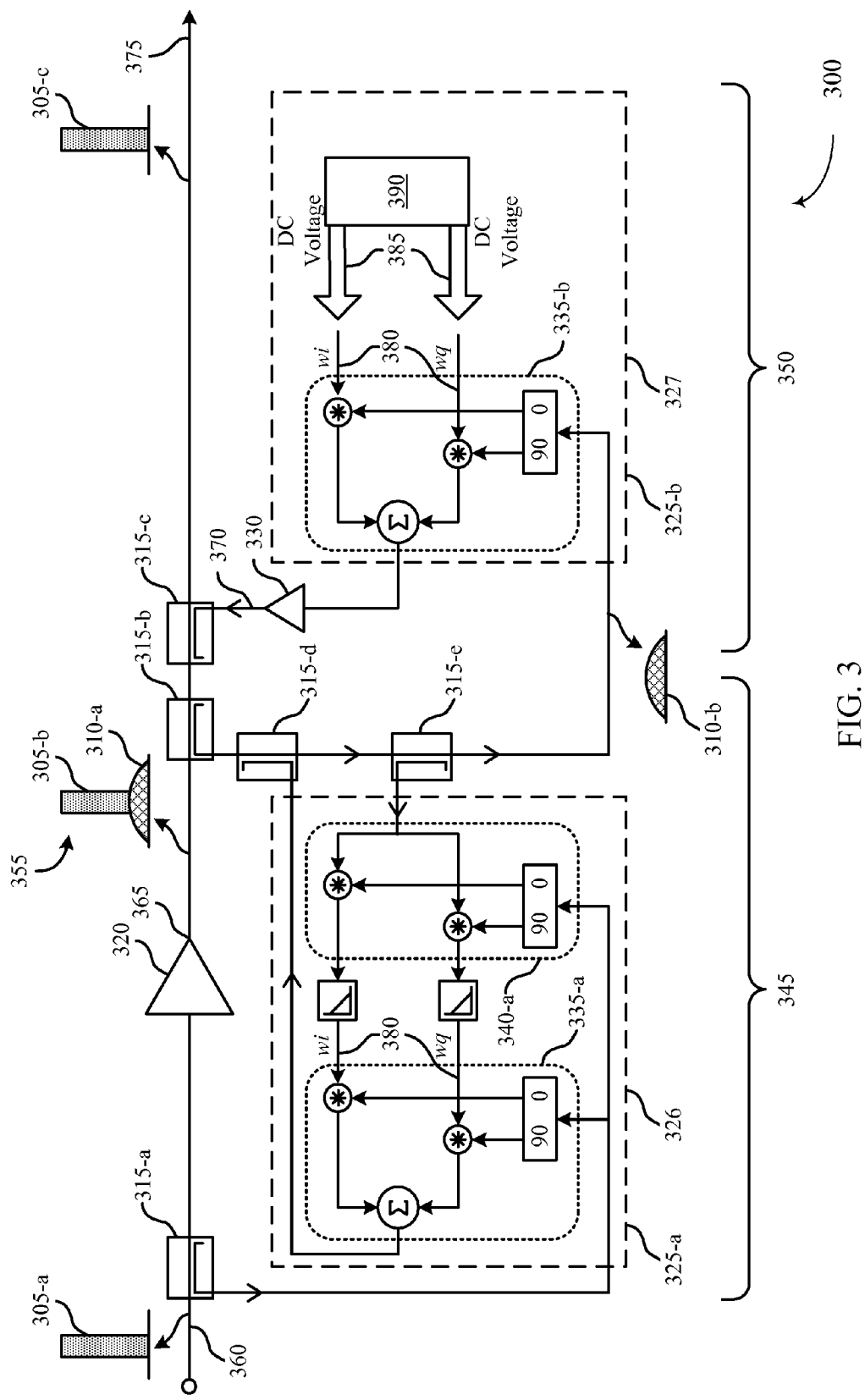
Figure 4:
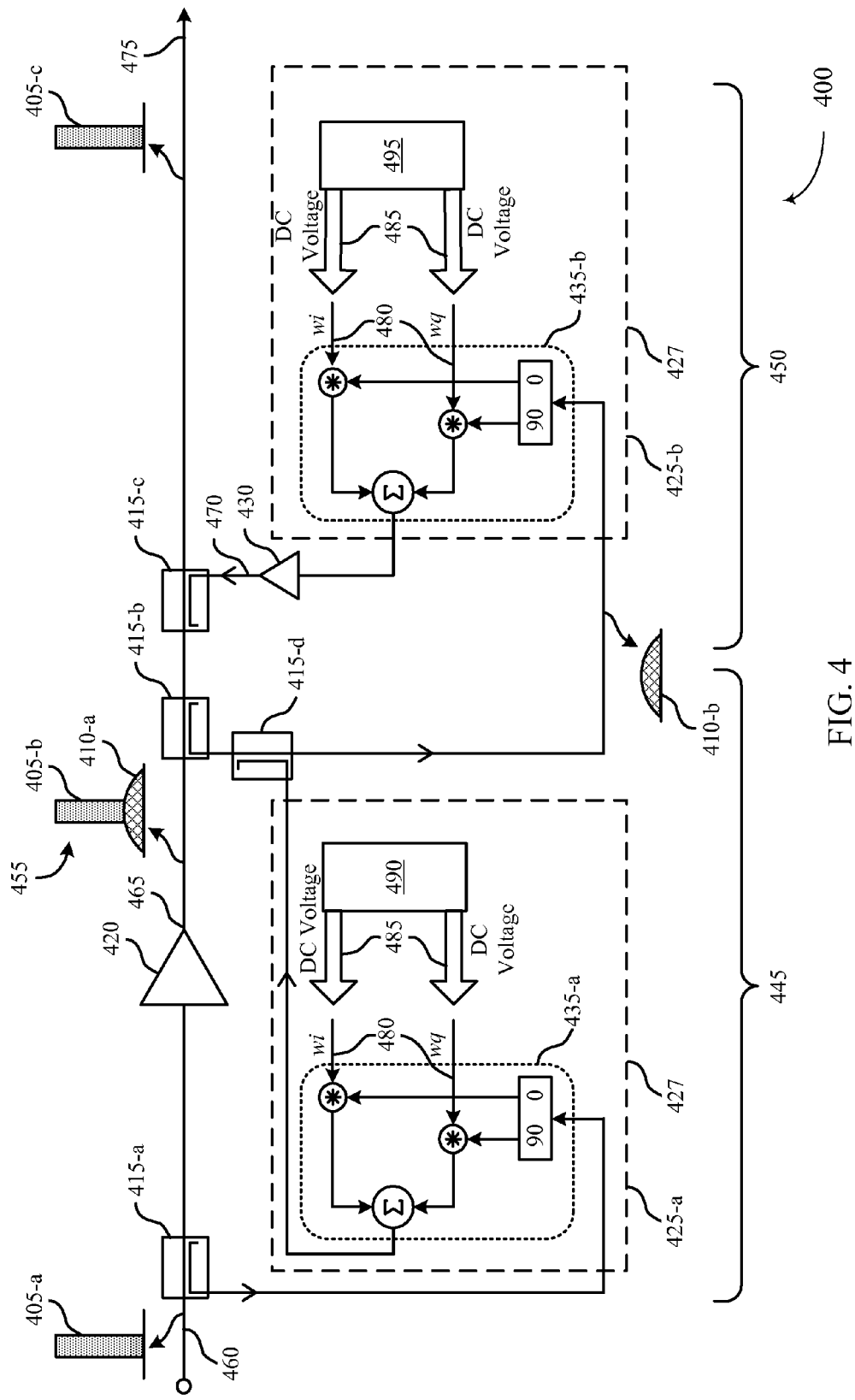

Therefore, a device (such as a UE 115, base station 105, or an AP 150) may utilize enhanced FF techniques to linearize an amplifier. The enhanced FF techniques may include use of adaptive filters. FIG. 2A illustrates an example of an FF linearizer 200-*a* using adaptive filters 226 in accordance with various aspects of the present disclosure. In FIG. 2A, the FF linearizer 200-*a* may illustrate aspects of a transmission path 260 at a transmitting device, such as at a UE 115 or at a base station 105, as described above with reference to FIG. 1. As shown in FIG. 2A, FF linearizer 200-*a* may interact with a PA 220 and may include a signal cancellation circuit 245 and an error cancellation circuit 250. The signal cancellation circuit 245 and the error cancellation circuit 250 may each include adaptive filters 226. The adaptive filters 226 may be analog adaptive filters. The adaptive filters 226 may additionally be fully adaptive filters, semi-adaptive filters, or a combination thereof. Examples of adaptive filters 226 used in the signal cancellation circuit 245 and the error cancellation circuit 250 may include LMS circuits 225, 325, 425, as illustrated in FIGS. 2B, 3 and 4 below.

As illustrated in FIG. 2A, a first signal 205-*a* may be transmitted on the transmission path 260 and input to a PA 220. The result of the first signal 205-*a* being input to the PA 220 is a PA output signal 255, generated at the output 265 of PA 220, The PA output signal 255 may include two components: both an amplified first signal 205-*b* and a distortion signal 210-*a*. The FF linearizer 200-*a* may be used to mitigate the distortion signal 210-*a*, thus resulting in an improved PA output signal 275.

The FF linearizer 200-*a* functions by using the signal cancellation circuit 245 to isolate a distortion signal 210-*b* from the PA output signal 255. The error cancellation circuit 250 is then used to amplify the distortion signal 210-*b* and negatively couple the distortion signal 210-*b* to the PA output signal 255 to result in the improved PA output signal 275. More specifically, in the signal cancellation circuit 245, a coupler 215-*a* is used to provide a reference signal 206-*a* to an adaptive filter 226-*a*. The reference signal 206-*a* is essentially a lower power version of the first signal 205-*a*. The adaptive filter 226-*a* generates an amplified reference signal 206-*b*. The PA output signal 255 is passed through coupler 215-*b* such that the amplified reference signal 206-*b* may be negatively coupled with a lower power version of the PA output signal 255 to generate the distortion signal 210-*b*. The distortion signal 210-*b* is input to the error cancellation circuit 250, which may use an adaptive filter 226-*b* to amplify the distortion signal 210-*b* to generate an error cancellation signal 270. The error cancellation signal 270 may be negatively coupled with the PA output signal 255 via coupler 215-*c* so as to result in the improved PA output signal 275.

As explained above, the signal cancellation circuit 245 and the error cancellation circuit 250 may each use adaptive filters 226. An LMS circuit may be an example of an adaptive filter utilized in either the signal cancellation circuit 245 or the error cancellation circuit 250 of the FF linearizer 200-*a*. An LMS circuit may determine the difference between a desired signal (e.g., input to the amplifier) and an actual signal (e.g., output of amplifier). The LMS circuit may update a set of filter or tap weights to estimate the transfer function associated with the amplifier and to remove the input signal from the distorted amplifier output signal. In some cases, the weights may be autonomously determined based at least in part on the difference between the input signal and the distorted amplifier output signal. Thus, an LMS circuit may be used in either fully adaptive filters or semi-adaptive filters. For example, the LMS circuit may be implemented using a vector demodulator that determines the weights applied to a vector modulator. The vector demodulator may be an in-phase and quadrature demodulator that may separate the input signal into an in-phase component and a quadrature component and may then multiply the difference between the input signal and the distorted amplifier output signal with the separated in-phase and quadrature components to generate the weights to be applied to a vector modulator. A single-tap LMS circuit, which may also be referred to as a 1-tap LMS filter, may be an example of a first order LMS circuit that generates one tap weight per input signal. The more taps used by a filter, meaning the higher order the filter, the more complex and costly the filter may be. While the examples discussed below include 1-tap LMS circuits, other sized filters may also be used.

FIGS. 2B, 3, and 4 illustrate examples of FF linearizers 200-*b*, 300, and 400 for adaptive FF linearization methods using adaptive filters in accordance with various aspects of the present disclosure. While FIG. 2A illustrated a generalized example, FIGS. 2B, 3, and 4 provide specific examples of the FF linearizer 200-*a* of FIG. 2A.

In FIG. 2B, the FF linearizer 200-*b* may illustrate aspects of a transmission path 260 at either a UE 115 or a base station 105, as described above with reference to FIG. 1. As shown in FIG. 2B, FF linearizer 200-*b* may interact with a PA 220 and may include couplers 215, LMS circuits 225 (in the form of adaptive filters), forward amplifier (FA) 230, vector modulators 235, vector demodulators 240, signal cancellation circuit 245, and error cancellation circuit 250.

First signal 205-*a*, PA output signal 255, and distortion signal 210-*a* may represent the frequency content of signals travelling through FF linearizer 200-*b* at certain points in the transmission path 260 of a wireless device such as UE 115 or base station 105. For example, the first signal 205-*a* may represent the frequency content of a signal prior to being input to the PA 220. The PA output signal 255 may include both a linear component (e.g., amplified first signal 205-*b*) and a non-linear component (e.g., distortion signal 210-*a*) and may be located at the output 265 of PA 220. The distortion signal 210-*a* may be isolated as distortion signal 210-*b*, which may then be used to counter the non-linear effects of PA 220 so as to generate the amplified first signal 205-*c*, which may be an improved PA output signal 275. The couplers 215 may obtain signals in the transmission path 260 of a device to produce lower power representations of the obtained signals, without substantially altering first signal 205-*a*. PA 220 may be used to amplify the first signal 205-*a*. Signal cancellation circuit 245 may utilize an LMS circuit 225-*a* (as a filter) and couplers 215-*b*, 215-*d*, 215-*e* to remove the amplified first signal 205-*b* from the PA output signal 255 yielding a distortion signal 210-*b*. Error cancellation circuit 250 may also utilize an LMS circuit 225-*b* (as a filter), couplers 215-*c*, 215-*f*, and an FA 230 to determine an isolated version of the distortion signal 210-*b* having a 180-degree phase shift and to reintroduce the phase shifted isolated distortion signal 210-*b* in the form of an error cancellation signal 270 to the transmission path 260 after the output 265 of PA 220 so as to remove the distortion from the signal at the output of the transmission path 260. Both the signal cancellation circuit 245 and the error cancellation circuit 250 may employ LMS circuits 225 to autonomously adapt filter coefficients 280, or weights, to adjust the magnitude and phase of signals input to the signal cancellation circuit 245 and the error cancellation circuit 250. In some cases, LMS circuits 225 may be implemented using purely analog components. FA 230 may be used to amplify an error cancellation signal 270 with the gain to match the magnitude of distortion signal 210-a. Accordingly, FF linearizer 200-b may autonomously update the filter coefficients 280 associated with LMS circuits 225 to adaptively remove non-linearity.

By removing non-linearity, a UE 115 or base station 105 may be used to transmit signals using a PA 220 without needing to widen the emission spectrum for a transmission and without producing (or at least reducing) interference in neighboring frequency bands. Additionally, distortion from amplifier gain drift due to environmental changes, such as variations in the supply voltage, temperature, and aging of components over time may be reduced. Furthermore, by using adaptive filters 226 (e.g., LMS circuits 225) and couplers 215, as illustrated in FIG. 2B, the FF linearizer 200-b may operate at increased efficiency. Further, if the adaptive filters 226 (e.g., LMS circuits 225) are analog adaptive filters, the FF linearizer 200-b may be applied to a transmission path without a need for analog-to-digital conversion. This means that the FF linearizer 200-b may autonomously match the magnitude and phase of PA 220 for signal and error cancellation at increased speeds and accuracy. Furthermore, fully adaptive filters, such as LMS circuits 225, may continuously match the magnitude and phase of PA 220 without using outside control.

In one example, signal cancellation circuit 245 may employ LMS circuit 225-a, couplers 215-b, 215-d, and 215-e, vector modulator 235-a, and vector demodulator 240-a to effectively remove first signal 205-b from PA output signal 255 to leave only the isolated distortion signal 210-b. LMS circuit 225-a may autonomously adapt the magnitude and phase of the first signal 205-a to ensure a least mean squares difference (e.g., isolated distortion signal 210-b) between PA output signal 255 and the amplified first signal 205-b. Therefore, first signal 205-a may be input to FF linearizer 200-b. First signal 205-a may pass through coupler 215-a which may produce a low power signal (e.g., 20 dB lower than first signal 205-a) that is representative of first signal 205-a, and which may be referred to as the reference signal 206-a. The reference signal 206-a may then be applied to signal cancellation circuit 245, which may proceed to separate the in-phase and quadrature components of the reference signal 206-a using vector demodulator 240-a.

Concurrent with the propagation of the reference signal 206-a, the first signal 205-a may continue to propagate through the FF linearizer 200-b until it reaches the input of PA 220. PA 220 may amplify the first signal 205-a to produce a PA output signal 255 having an amplified first signal 205-b and a distortion component (e.g., distortion signal 210-a). In some cases, the distortion component may be more prominent when PA 220 engages in high power transmissions or otherwise operates in a saturation region. The distortion component may extend into neighboring frequencies of the frequency band associated with first signal 205-a. The PA output signal 255 may then pass through coupler 215-b, which may produce a low-power signal that is representative of the PA output signal 255. The output of coupler 215-b may then be coupled with the output of the LMS circuit 225-a via coupler 215-d. The output of the LMS circuit 225-a may be a phase-shifted and amplified version of the reference signal 206-a. Thus, the coupling of the output of the LMS circuit 225-a with the output of coupler 215-b via coupler 215-d may yield an error signal. In steady state, the error signal may be the difference between the first signal 205-a and the PA output signal 255, or in other words, isolated distortion signal 210-b.

The PA output signal 255, as acted upon by the output of the LMS circuit 225-a, may pass through coupler 215-e. Coupler 215-e may then forward the PA output signal 255, as acted upon by the output of the LMS circuit 225-a, to vector demodulator 240-a to be multiplied with the in-phase and quadrature components of the reference signal 206-a. The output of vector demodulator 240-a may be used as coefficients 280 in the form of weights $w_i$ and $w_q$, which may be applied to the in-phase and quadrature components of the reference signal 206-a within vector modulator 235-a. Therefore, the weights may be used to adapt LMS circuit 225-a. In some cases, LMS circuit 225-a may be implemented as an LMS filter, such as a single-tap adaptive filter. The in-phase and quadrature components of the reference signal 206-a, as weighted by coefficients 280, may then be recombined and input to coupler 215-d. The output of LMS circuit 225-a at coupler 215-d may then be combined with the output of coupler 215-b to further refine the generation of isolated distortion signal 210-b, meaning that at least a portion of the PA output signal 255 (e.g., at least a portion of the amplified first signal 205-b) may be canceled as a result of the combination. This process (e.g., the use of LMS circuit 225-a) may continue until the LMS circuit 225-a reaches a point of stable equilibrium. The isolated distortion signal 210-b is output by the signal cancellation circuit 245.

The isolated distortion signal 210-b may then be applied to error cancellation circuit 250. The isolated distortion signal 210-b may additionally be injected at other locations in a device that may receive and utilize isolated distortion signal 210-b, which may be referred to as "injection points." For instance, the isolated distortion signal 210-b may be provided to a receiver and used for interference cancellation to cancel interference that may arise in the receiver from PA 220. In another case, the isolated distortion signal 210-b may be provided to the output of another PA for intermodulation distortion (IMD) cancellation of IMD arising from the PA 220 during carrier aggregated transmissions (e.g., UL CA transmissions). Coupling the isolated distortion signal 210-b to a receiver or to another PA may be facilitated by use of a coupling channel, a diplexer, or a duplexer, for example.

Error cancellation circuit 250 may employ LMS circuit 225-b, couplers 215-c and 215-f, vector modulator 235-b, vector demodulator 240-b, and FA 230 to effectively remove distortion signal 210-a from PA output signal 255 to leave only undistorted first signal 205-c (in the form of an improved PA output signal 275) at the end of the transmission path 260. The isolated distortion signal 210-b may be input to LMS circuit 225-b, where the output signal may be similarly modulated and demodulated, via vector modulator 235-b and vector demodulator 240-b, to determine filter coefficients 280 and to produce an error cancellation signal 270. Specifically, the output of coupler 215-f may be multiplied by the in-phase component and the quadrature component of the isolated distortion signal 210-b at vector demodulator 240-b in order to generate coefficients 280, which may then be applied to the in-phase component and the quadrature component of the isolated distortion signal 210-b at vector modulator 235-b to generate error cancellation signal 270. The error cancellation signal 270 may be amplified by FA 230 and reintroduced into the output of the transmission path 260 via coupler 215-c to remove, by negative coupling, the distortion signal 210-a from PA output signal 255 and to yield the undistorted first signal 205-c. The undistorted first signal 205-c may be further coupled to error cancellation circuit 250 via coupler 215-f to refine the error cancellation and minimize distortion in the signal that may be transmitted (e.g., undistorted first signal 205-c in the form of an improved PA output signal 275).

FIG. 3 shows an FF linearizer 300 that illustrates a variation of FF linearizer 200-b. FF linearizer 300 may be a hybrid approach that includes analog adaptive filters 326 in the form of an adaptive and a semi-adaptive circuit to remove non-linearity from the transmission path 360 and uses less power than FF linearizer 200-b. A semi-adaptive circuit may consume less power than a fully adaptive circuit by reducing the number of active components used to implement the circuit. The semi-adaptive circuit may also adapt to changes in PA distortion at a slower rate. FF linearizer 300 may include couplers 315-a through 315-e, which may be examples of couplers 215; LMS circuit 325-a, which may be an example of LMS circuit 225-a in the form of an analog adaptive filter 326; vector modulators 335-a and 335-b, which may be examples of a vector modulator 235; vector demodulator 340-a, which may be an example of a vector demodulator 240; PA 320, which may be an example of PA 220; FA 330, which may be an example of FA 230; and signal cancellation circuit 345 which may be an example of signal cancellation circuit 245 with respect to FIG. 2B. FF linearizer 300 may also include error cancellation circuit 350, which may incorporate aspects of error cancellation circuit 250 but may use a semi-adaptive LMS circuit 325-b as an analog semi-adaptive filter 327.

First signal 305-a may travel through FF linearizer 300 similar to the transmission path 260 described for first signal 205-a, and an isolated distortion signal 310-b may also be similarly generated as the isolated distortion signal 210-b, as described in FIG. 2B. The error cancellation circuit 350, however, may employ a semi-adaptive LMS circuit 325-b as an analog semi-adaptive filter 327. Semi-adaptive LMS circuit 325-b may be implemented as a simplified LMS circuit. The filter coefficients 280, or weights, for the semi-adaptive LMS circuit 325-b may be input as applied DC voltages instead of being based at least in part on the output of the transmission path 360. The DC control voltages 385 may be generated in either the analog domain or the digital domain (e.g., using a microcontroller, DSP, FPGA, etc.). In some cases, the DC control voltage 385 may be created using steepest descent algorithms, such as stochastic approximation or sign stochastic approximation, as applied to the improved PA output signal 375 by a signal processor 390. For example, stochastic approximation techniques may include analysis of the improved PA output signal 375 as different valued coefficients 380 are applied in the error cancellation circuit 350. With each application of a coefficient 380, the signal processor 390 applies a steepest descent algorithm such as a sign stochastic approximation to determine whether the power of the improved PA output signal 375 is increasing or decreasing. An increase in power would indicate that the changes in the coefficients 380 may have been made in a correct direction, whereas a decrease in power of the improved PA output signal 375 may indicate that the changes in the coefficients 380 were in an incorrect direction. The signal processor 390 may continue to alter the coefficients 380 until a local minimum is found, meaning that the identified coefficients 380 may be used to minimize the distortion at the transmission output (e.g., first signal 305-c in the form of the improved PA output signal 375). DC control voltages 385 or filter coefficients 380 may also be determined during testing of the PA 320 and may be stored in the device (e.g., in the signal processor 390). The DC control voltages 385 may be adapted according to a model that has been developed for the PA 320 to adapt to gain drift over the life of the PA 320 or based on measurements over the transmission path 360 (e.g., based on identifying changes in PA 320 output for known PA inputs or first signal 305-a). For example, the signal processor 390 may include a table mapping known PA 320 outputs for known PA inputs or first signals 305-a. The signal processor 390 may obtain a measurement of a first signal 305-a and a corresponding improved PA output signal 375 and compare these with values stored in or available to the signal processor 390. If the comparison is favorable, the DC control voltages 385 are not altered; if the comparison is not favorable (meaning that that difference is greater than some predefined threshold), then the DC control voltages 385 are altered. Alternatively, the determined DC voltage may remain the same over the life of the PA 320. Implementing the coefficient 380 as a constant or gradually adapted DC control voltage 385 may reduce power consumption and costs associated with error cancellation.

In other cases, the DC control voltage 385 may be set to zero or another value such that the DC offset is zero to bypass the semi-adaptive filter 327. In some cases, a device may bypass the simplified LMS circuit 325-b based at least in part on the distortion signal 310-a measured at the output 365 of the PA 320. The distortion signal 310-a may be determined, for example, by using the signal processor 390 to compare expected gain values for known values of a first signal 305-a with actual gain values of the first signal 305-a; a difference between the expected and measured gain values may approximate the distortion signal 310-a. If the distortion signal 310-a is identified to be below a threshold value, the device may provide a net DC voltage of zero to the vector modulator. Accordingly, the filter weights (e.g., coefficients 380) may also be zero, and when the in-phase and quadrature components of the isolated distortion signal 310-b are mixed with the filter weights, the error cancellation signal 370 may also have a net value of zero. Bypassing semi-adaptive LMS circuit 325-b may effectively bypass the error cancellation circuit 350, and may further increase power efficiency of FF linearizer 300 and the transmission chain. In some cases, a device may bypass the error cancellation circuit 350 when distortion is low (e.g., during low or medium power transmissions) and may activate the error cancellation circuit 350 when distortion is high (e.g., during high power transmissions). Additionally or alternatively, the device may bypass the error cancellation circuit 350 when the device is not actively transmitting using FF linearizer 300. In this way, the device may opportunistically increase or decrease power consumption and may increase the average power efficiency. The isolated distortion signal 310-b may also be injected at other locations in the device such as at a receiver for interference cancellation or at another PA for IMD suppression. In some cases, the mixers may be replaced with voltage controlled attenuators.

FIG. 4 shows an FF linearizer 400 that illustrates a variation of FF linearizers 200-b and 300. FF linearizer 400 may further conserve power by utilizing analog adaptive filters in the form of two semi-adaptive circuits used as analog semi-adaptive filters 427. Using two-semi adaptive circuits may further decrease the number of active components used at FF linearizer 400. FF linearizer 400 may include couplers 415-a through 415-d, which may be examples of couplers 215 or 315; LMS circuits 425-a and 425-b, which may be examples of LMS circuit 325-b and may be analog semi-adaptive filters 427; vector modulators 435-a and 435-b, which may be examples of a vector modulator 235 or 335; PA 420, which may be an example of PA 220 or 320; FA 430, which may be an example of FA 230 or 330; and error cancellation circuit 450, which may be an example of error cancellation circuit 350 with respect to FIGS. 2B and 3. FF linearizer 400 may also include signal cancellation circuit 445, which may incorporate aspects of signal cancellation circuit 245 or 345 but may use semi-adaptive LMS circuit 425-a.

In this case, first signal 405-a may travel through FF linearizer 400 similar to the transmission paths 360, 260 of first signal 305-a and 205-a, and isolated distortion signal 410-b may be generated from an output of semi-adaptive LMS circuit 425-a. The isolated distortion signal 410-b may then be input to semi-adaptive LMS circuit 425-b, which creates an error cancellation signal 470 that may be amplified and introduced to the output 465 of the PA at the end of the transmission path 460. The resultant first signal 405-c is in the form of an improved PA output signal 475. The filter coefficients 480, or weights, for both semi-adaptive LMS circuit 425-a and 425-b may be DC control voltages 485 generated by signal processors 490, 495. The DC control voltage 485 may be applied to the semi-adaptive LMS circuits 425, and may be generated as described above with respect to signal processor 390 (of FIG. 3). One or both of the LMS circuits 425 may be bypassed, by injecting a voltage with a DC offset of 0V, if the measured distortion is below a threshold value (e.g., while the PA operates in the linear region) or, in another case, if the device is not actively transmitting using FF linearizer 400. Bypassing semi-adaptive LMS circuit 425-b may effectively bypass the error cancellation circuit 450, and may further increase power efficiency of FF linearizer 400 and the transmission chain. Bypassing semi-adaptive LMS circuit 425-a may effectively bypass the signal cancellation circuit 445, and may further increase the power efficiency of FF linearizer 400. As described above, a device that utilizes semi-adaptive LMS circuits 425 may opportunistically decrease and increase the power consumed by the device and may increase the overall efficiency of the device. Furthermore, generating control voltages 485 to determine the filter weights may provide decreased rates of adaptation if the PA distortion does not change rapidly over time. This may reduce computational demands which further increase the efficiency of FF linearizer 400. The isolated distortion signal 410-b may be injected at other injection points at the device for interference and IMD cancellation. Additionally, the mixing components for the DC voltage and reference signal may be implemented using voltage controlled attenuators.

Figure 5:
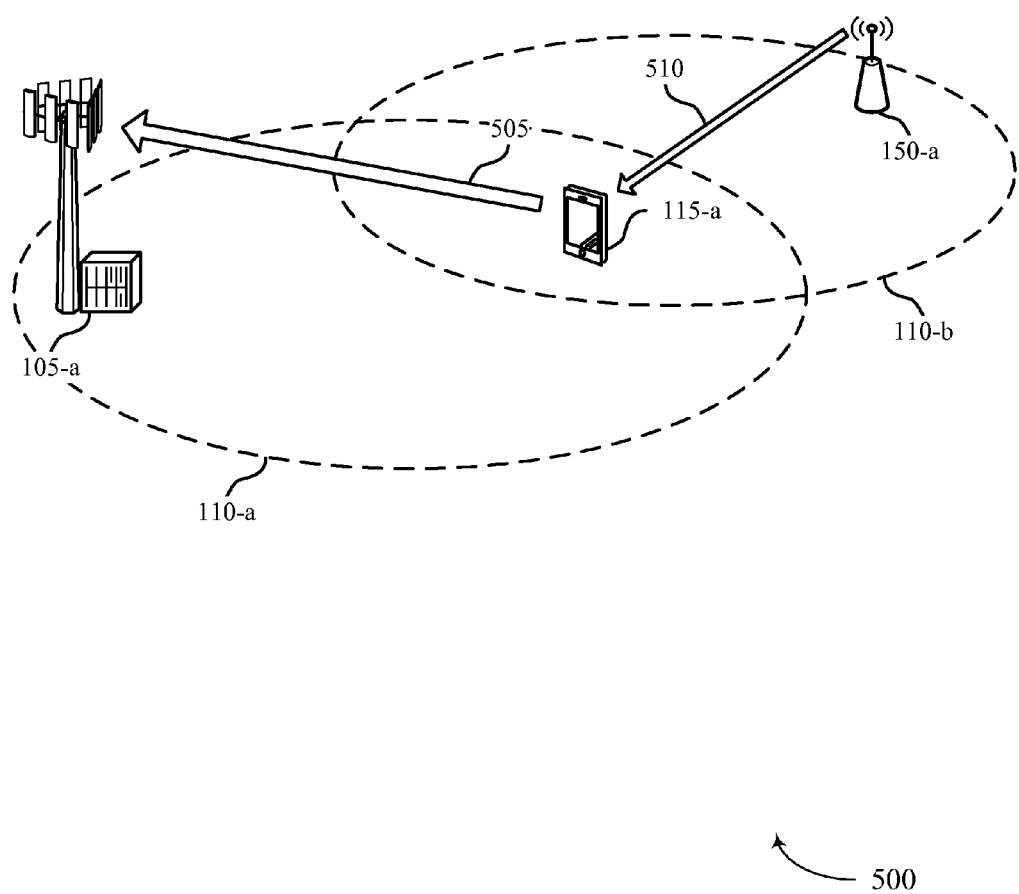
FIG. 5 illustrates an example of a wireless communication subsystem for adaptive FF linearization using adaptive filters in accordance with various aspects of the present disclosure.

FIG. 5 illustrates an example of a wireless communications subsystem 500 for adaptive FF linearization using analog adaptive filters in accordance with various aspects of the present disclosure. Wireless communications subsystem 500 may include UE 115-a, base station 105-a, and AP 150-a, which may be examples of a UE 115, a base station 105, or an AP 150 and may communicate with one another within coverage areas 110-a and 110-b as generally described above with reference to FIG. 1. In one example base station 105-a may be an LTE device, AP 150-a may be a Wi-Fi device, and UE 115-a may be an LTE device that is also capable of communicating over Wi-Fi. In some examples, FF linearizers 200-b, 300, and 400, as described in FIGS. 2B-4, may be implemented in UE 115-a.

In one example, UE 115-a may communicate with base station 105-a via communication link 505. UE 115-a may utilize a PA that employs an adaptive FF control loop, such as FF linearizer 200-b, 300, or 400, to transmit data to base station 105-a with limited out of band emissions. For instance, the device provides a first signal 205, 305, or 405 to the input of the PA and the FF control loop may remove distortion from the PA output so that the data transmitted over communication link 505 substantially includes only the first signal 205, 305, or 405 (e.g., the distortion is substantially close to the noise floor). UE 115-a may concurrently receive a message (e.g., a beacon, probe response, etc.) from AP 150-a over communication link 510. Without substantial interference from the LTE transmission, UE 115-a may successfully decode the Wi-Fi communication. In some cases, the adaptive FF control loop uses semi-adaptive circuits and produces control voltages 385, 485 for adapting the FF linearizer. UE 115-a may additionally compare a measured distortion signal against a threshold to determine whether to bypass one or both of the semi-adaptive circuits. In yet another case, UE 115-a may provide the distortion signal at other injection points within UE 115-a. For instance, the distortion signal may be provided to a receiver circuit within UE 115-a and used by the receiver to compensate for distortion caused by the PA. Additionally, the UE 115-a may provide the distortion signal to another PA used for transmissions at UE 115-a to cancel IMD during carrier aggregated transmissions. Interference coupling to a receiver or to another PA may be facilitated by use of a coupling channel, a diplexer, or a duplexer, for example.

Figure 6:
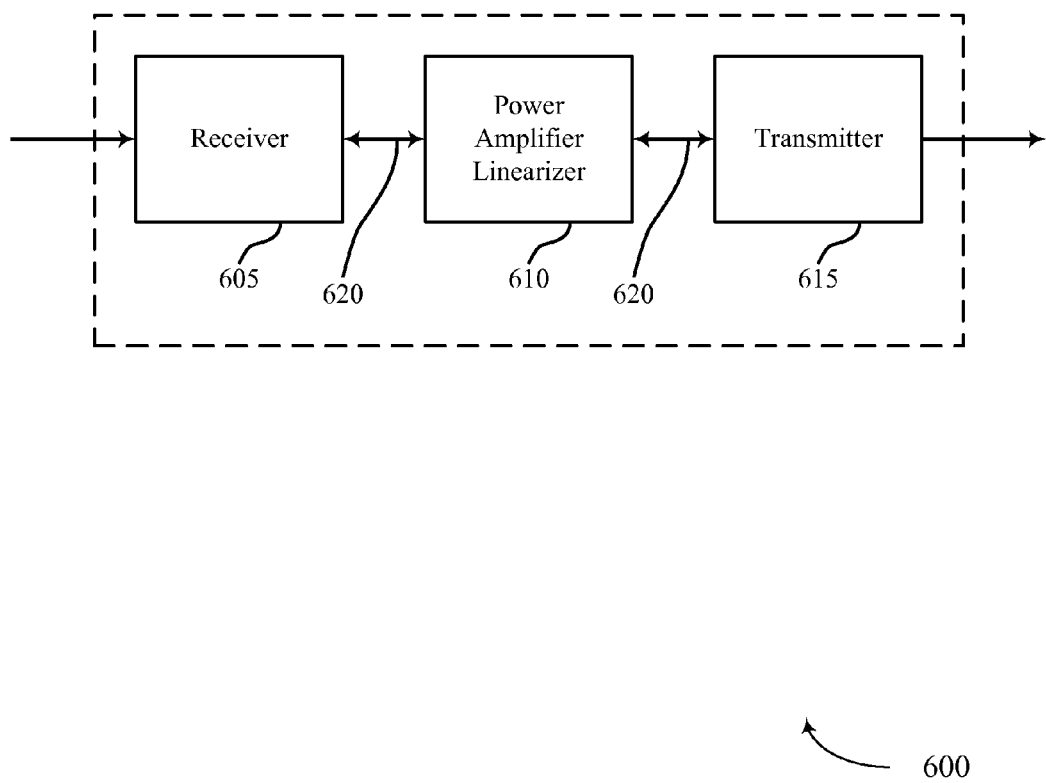
FIGS. 6-8 show block diagrams of a wireless device that supports adaptive FF linearization methods using adaptive filters in accordance with various aspects of the present disclosure.

FIG. 6 shows a block diagram of a wireless device 600 configured for adaptive FF linearization methods using adaptive filters in accordance with various aspects of the present disclosure. Wireless device 600 may be an example of aspects of a device, such as a UE 115, base station 105, or AP 150 described with reference to FIGS. 1-5. Wireless device 600 may include a receiver 605, a PA linearizer 610, or a transmitter 615. Wireless device 600 may also include a processor. Each of these components may be in communication with each other.

The receiver 605 may receive information such as packets, user data, or control information associated with various information channels (e.g., control channels, data channels, and information related to adaptive FF linearization methods using adaptive filters, etc.). Information may be passed on to the PA linearizer 610, and to other components of wireless device 600.

The PA linearizer 610 may provide a first signal to an input of a PA in a transmission path 620 of the wireless device 600, produce a distortion signal based at least in part on the first signal and an output of the PA, and produce an improved output signal by cancelling distortion at the output of the PA using the distortion signal. In some cases, a FF linearizer as described in FIGS. 2A-4 may be an example of PA linearizer 610.

The transmitter 615 may transmit signals received from other components of wireless device 600. In some examples, the transmitter 615 may be collocated with the receiver 605 in a transceiver module. The transmitter 615 may include a single antenna, or it may include a plurality of antennas. In some cases, the transmitter 615 may include the PA linearizer 610.

Figure 7:
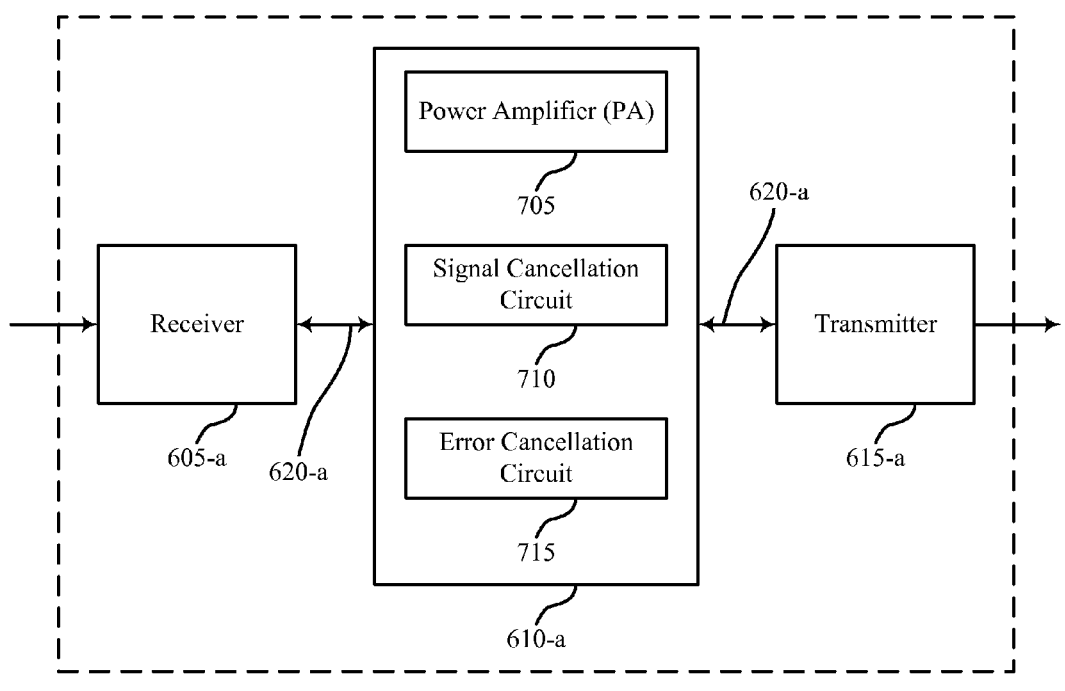

FIG. 7 shows a block diagram of a wireless device 700 for adaptive FF linearization methods using adaptive filters in accordance with various aspects of the present disclosure. Wireless device 700 may be an example of aspects of a wireless device 600 or a device, such as a UE 115, base station 105, or AP 150, described with reference to FIGS. 1-6. Wireless device 700 may include a receiver 605-a, a PA linearizer 610-a, or a transmitter 615-a. Wireless device 700 may also include a processor. Each of these components may be in communication with each other. The PA linearizer 610-a may also include a PA 705, a signal cancellation circuit 710, and an error cancellation circuit 715.

The receiver 605-a may receive information which may be passed on to PA linearizer 610-a, and to other components of wireless device 700. The PA linearizer 610-a may perform the operations described with reference to FIG. 6. The transmitter 615-a may transmit signals received from other components of wireless device 700.

A first signal may be provided to an input of PA 705 in a transmission path 620-a of wireless device 700 as described with reference to FIGS. 2A-5. The PA 705 may also use LMS semi-adaptive filters to produce the distortion signal and to produce an error cancellation signal for producing the improved output signal, as described above with relation to FIGS. 2A-5, and as further described below in relation to the signal cancellation circuit 710 and the error cancellation circuit 715.

The signal cancellation circuit 710 may isolate a distortion signal based at least in part on the first signal and an output of the PA as described with reference to FIGS. 2A-5. In some examples, isolating the distortion signal comprises isolating the distortion signal based at least in part on the first signal and the output of the PA via a feedback circuit. In some cases, the signal cancellation circuit 710 uses one or more LMS adaptive filters to produce the distortion signal. A set of coefficients may be autonomously generated for the one or more LMS adaptive filters based at least in part on an output of the LMS adaptive filter. In some examples, the LMS adaptive filter is a 1-tap adaptive filter.

The error cancellation circuit 715 may produce an improved output signal by cancelling distortion at the output of the PA using the distortion signal as described with reference to FIGS. 2A-5. In some examples, producing the improved output signal comprises producing an error cancellation signal based at least in part on the output of the PA, the distortion signal, and the improved output signal via a feedback circuit. In some cases, the error cancellation circuit 715 uses one or more LMS adaptive filters (e.g., LMS circuits 225 of FIG. 2B) to produce the error cancellation signal and for producing the improved output signal. A set of coefficients may be autonomously generated for the one or more LMS adaptive filters based at least in part on an output of the LMS adaptive filter. In some examples, the LMS adaptive filter is a 1-tap adaptive filter.

In some cases, the signal cancellation circuit 710 may use an LMS adaptive filter (e.g., LMS circuit 325-a of FIG. 3) to isolate the distortion signal while the error cancellation circuit 715 uses an LMS semi-adaptive filter (e.g., LMS circuit 325-b of FIG. 3) to produce an error cancellation signal and for producing the improved output signal. In other cases, both the signal cancellation circuit 710 and the error cancellation circuit 715 may use an LMS semi-adaptive filter (e.g., LMS circuits 425 of FIG. 4) to produce an error cancellation signal and for producing the improved output signal.

Figure 8:
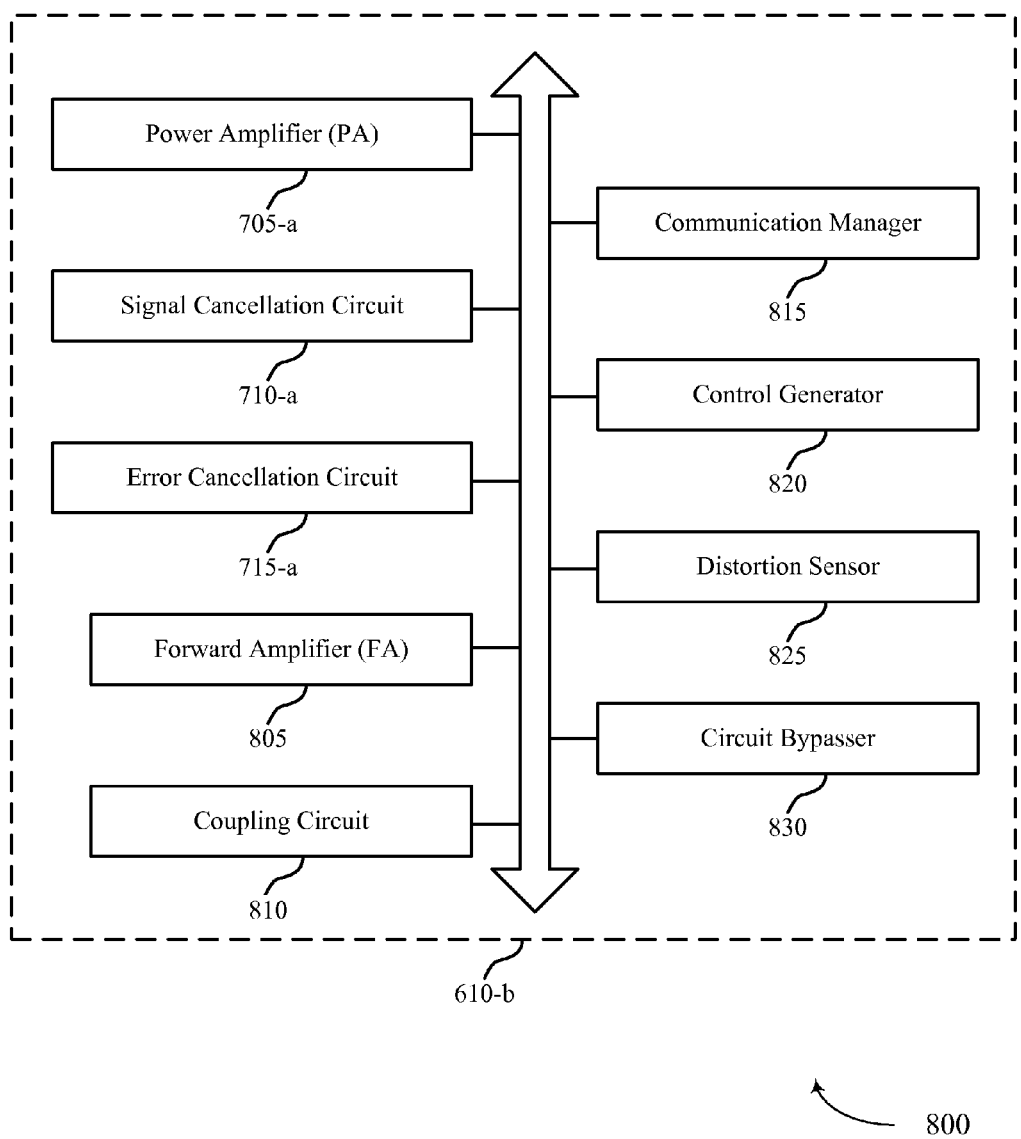

FIG. 8 shows a block diagram 800 of a PA linearizer 610-b which may be a component of a wireless device 600 or a wireless device 700 for adaptive FF linearization methods using adaptive filters in accordance with various aspects of the present disclosure. The PA linearizer 610-b may be an example of aspects of a PA linearizer 610 described with reference to FIGS. 6-7. The PA linearizer 610-b may include a PA 705-a, a signal cancellation circuit 710-a, and an error cancellation circuit 715-a. Each of these modules may perform the functions described with reference to FIG. 7. The PA linearizer 610-b may also include an FA 805, a coupling circuit 810, a communication manager 815, a control generator 820, a distortion sensor 825, and a circuit bypasser 830. Certain components of PA linearizer 610-b may be coupled or combined with one another.

The FA 805 may be configured such that the producing the improved output signal may include amplifying the error cancellation signal as described with reference to FIGS. 2A-5.

The coupling circuit 810 may be configured such that the producing the improved output signal may include introducing the amplified error cancellation signal to the output of the PA via a coupling circuit 810 as described with reference to FIGS. 2A-5.

The communication manager 815 may provide the distortion signal to an injection point at the wireless device as described with reference to FIGS. 2A-5. The injection point may include any of a receiver at the wireless device, another PA at the wireless device, or any combination thereof.

The control generator 820 may generate a coefficient for the LMS semi-adaptive filter via a control voltage, wherein the control voltage may be adapted in the digital domain or the analog domain as described with reference to FIGS. 2A-5. The control generator 820 may also determine the control voltage based at least in part on a steepest descent algorithm. The control generator 820 may also generate a first set of coefficients via a first control voltage for the LMS semi-adaptive filter producing the distortion signal and a second set of coefficients via a second control voltage for the LMS semi-adaptive filter producing the error cancellation signal, wherein the first control voltage and the second control voltage may be adapted in the digital domain or the analog domain. In some examples, the bypassing comprises applying a control voltage that has a net voltage of zero.

The distortion sensor 825 may measure an amount of distortion associated with the distortion signal as described with reference to FIGS. 2A-5.

The circuit bypasser 830 may bypass, based at least in part on the measured distortion, at least one of the producing of the distortion signal or the producing of an error cancellation signal for producing the improved output signal as described with reference to FIGS. 2A-5.

Figure 9:
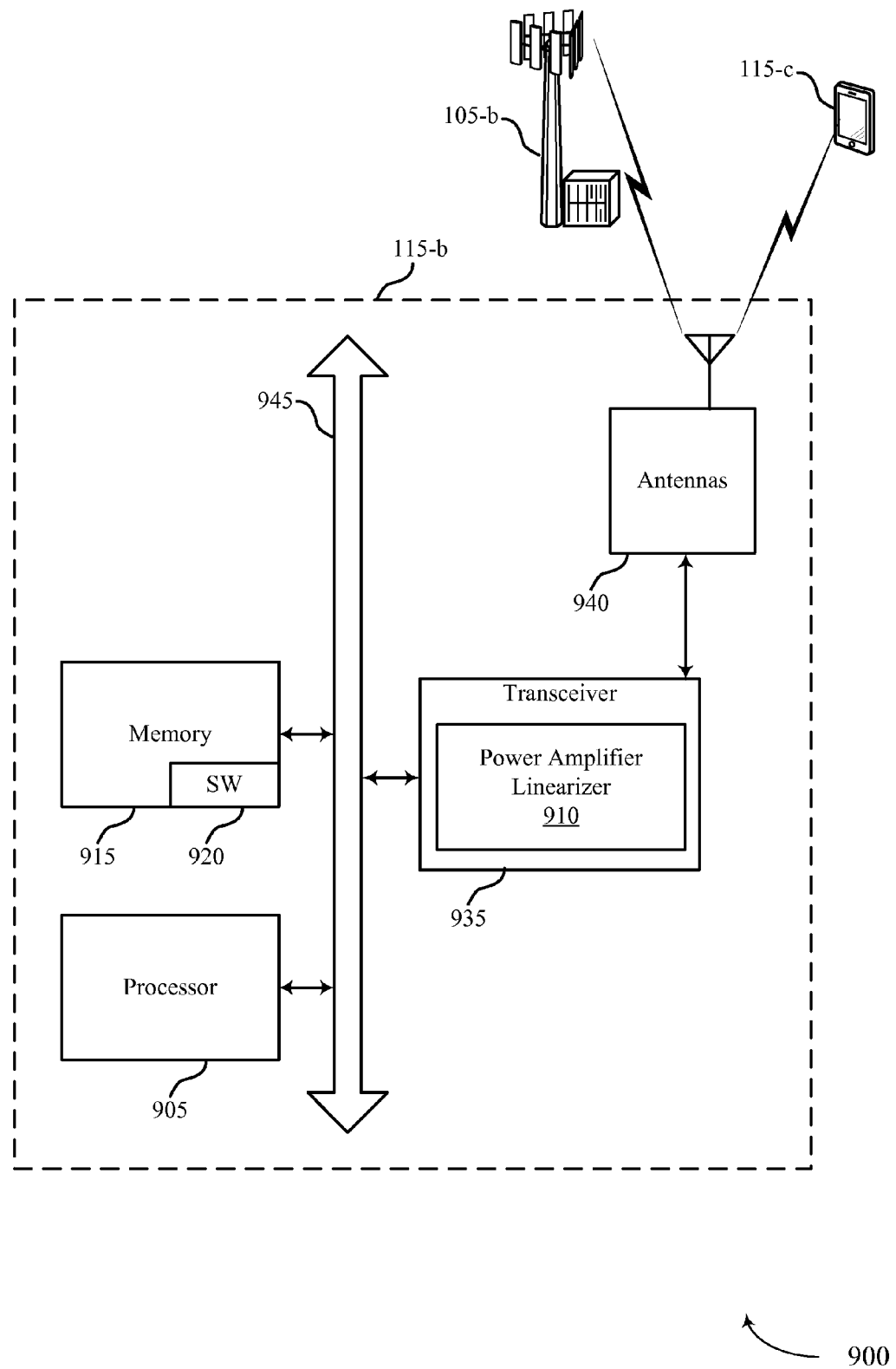
FIG. 9 illustrates a block diagram of a system including a device that supports adaptive FF linearization methods using adaptive filters in accordance with various aspects of the present disclosure.

FIG. 9 shows a diagram of a system 900 including a UE 115-b configured for adaptive FF linearization methods using adaptive filters in accordance with various aspects of the present disclosure. System 900 may include UE 115-b, which may be an example of a wireless device 600, a wireless device 700, or a UE 115 described with reference to FIGS. 1 and 5-8. UE 115-b may include a PA linearizer 910, which may be an example of a PA linearizer 610 described with reference to FIGS. 6-8. UE 115-b may also include components for bi-directional voice and data communications including components for transmitting communications and components for receiving communications. For example, UE 115-b may communicate bi-directionally with UE 115-c or base station 105-b.

UE 115-b may also include a processor 905, memory 915 (including software (SW) code 920, a transceiver 935, and one or more antenna(s) 940, each of which may communicate, directly or indirectly, with one another (e.g., via buses 945). The transceiver 935 may communicate bi-directionally, via the antenna(s) 940 or wired or wireless links, with one or more networks, as described above. For example, the transceiver 935 may communicate bi-directionally with the base station 105-b or another UE 115-c. The transceiver 935 may include a modem to modulate the packets and provide the modulated packets to the antenna(s) 940 for transmission, and to demodulate packets received from the antenna(s) 940. The PA linearizer 910 may be included, at least in part, with the transceiver 935. While UE 115-b may include a single antenna 940, UE 115-*b* may also have multiple antennas 940 capable of concurrently transmitting or receiving multiple wireless transmissions.

The memory 915 may include random access memory (RAM) and read only memory (ROM). The memory 915 may store computer-readable, computer-executable software/firmware code 920 including instructions that, when executed, cause the processor 905 to perform various functions described herein (e.g., adaptive FF linearization methods using adaptive filters, etc.). Alternatively, the software/firmware code 920 may not be directly executable by the processor 905 but cause a computer (e.g., when compiled and executed) to perform functions described herein. The processor 905 may include an intelligent hardware device, (e.g., a central processing unit (CPU), a microcontroller, an application specific integrated circuit (ASIC), etc.)

Figure 10:
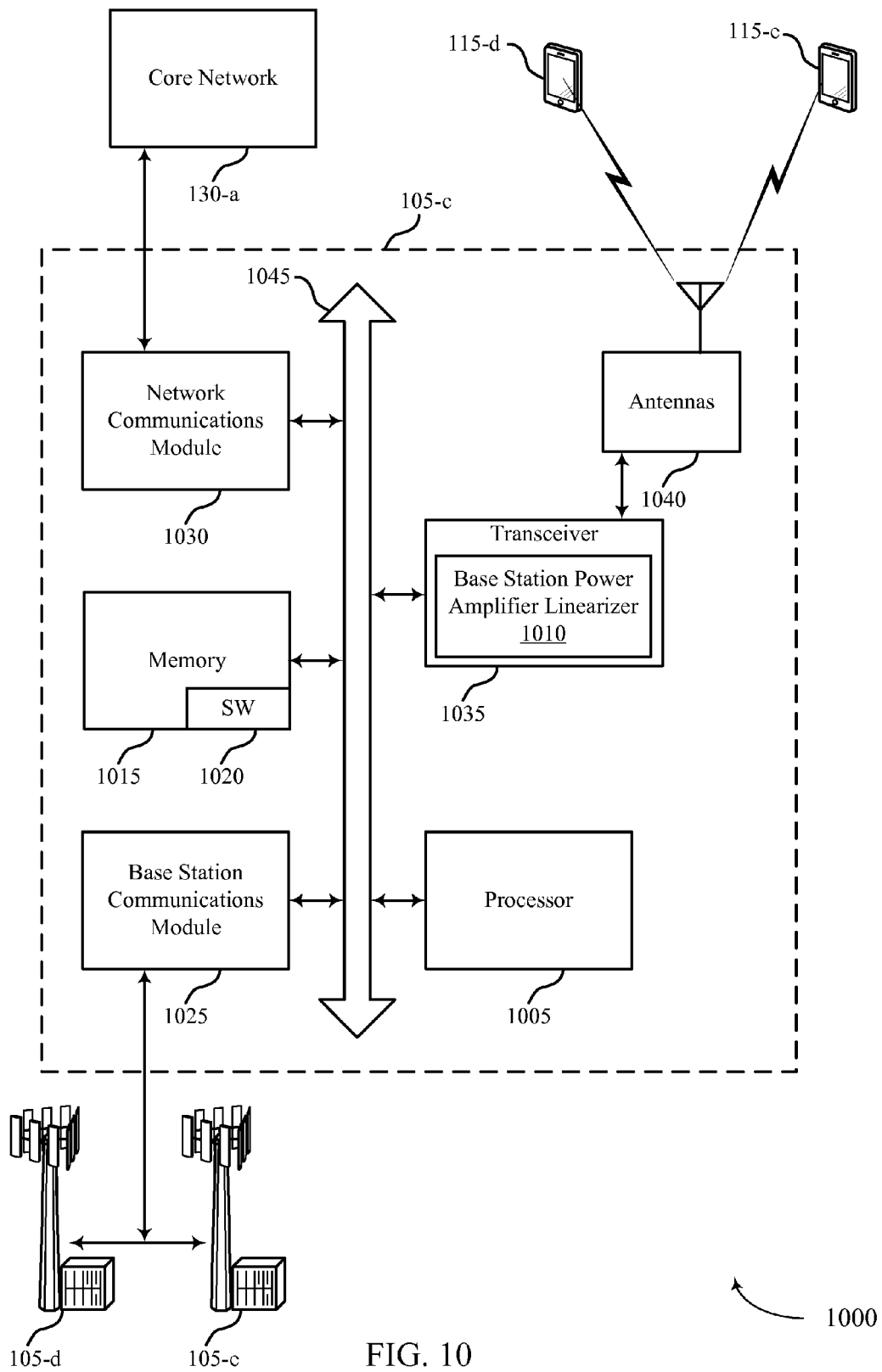
FIG. 10 illustrates a block diagram of a system including a base station that supports adaptive FF linearization methods using adaptive filters in accordance with various aspects of the present disclosure.

FIG. 10 shows a diagram of a system 1000 including a base station 105-*c* configured for adaptive FF linearization methods using adaptive filters in accordance with various aspects of the present disclosure. System 1000 may include base station 105-*c*, which may be an example of a wireless device 600, a wireless device 700, or a base station 105 described with reference to FIGS. 1 and 5-8. Base station 105-*c* may include a base station PA linearizer 1010, which may be an example of a PA linearizer 610 described with reference to FIGS. 6-8. Base station 105-*c* may also include components for bi-directional voice and data communications including components for transmitting communications and components for receiving communications. For example, base station 105-*c* may communicate bi-directionally with UE 115-*d* or UE 115-*e*.

In some cases, base station 105-*c* may have one or more wired backhaul links. Base station 105-*c* may have a wired backhaul link (e.g., 51 interface, etc.) to the core network 130-*a*. Base station 105-*c* may also communicate with other base stations 105, such as base station 105-*d* and base station 105-*e* via inter-base station backhaul links (e.g., an X2 interface). Each of the base stations 105 may communicate with UEs 115 using the same or different wireless communications technologies. In some cases, base station 105-*c* may communicate with other base stations such as 105-*d* or 105-*e* utilizing base station communications module 1025. In some examples, base station communications module 1025 may provide an X2 interface within a LTE/LTE-A wireless communication network technology to provide communication between some of the base stations 105. In some examples, base station 105-*c* may communicate with other base stations through core network 130-*a*. In some cases, base station 105-*c* may communicate with the core network 130 through network communications module 1030.

The base station 105-*c* may include a processor 1005, memory 1015 (including software (SW) code 1020), transceiver 1035, and antenna(s) 1040, which each may be in communication, directly or indirectly, with one another (e.g., over bus system 1045). The transceivers 1035 may be configured to communicate bi-directionally, via the antenna(s) 1040, with the UEs 115, which may be multi-mode devices. The transceiver 1035 (or other components of the base station 105-*c*) may also be configured to communicate bi-directionally, via the antennas 1040, with one or more other base stations (not shown). The transceiver 1035 may include a modem configured to modulate the packets and provide the modulated packets to the antennas 1040 for transmission, and to demodulate packets received from the antennas 1040. The base station 105-*c* may include multiple transceivers 1035, each with one or more associated antennas 1040. The transceiver may be an example of a combined receiver 605 and transmitter 615 of FIG. 6. The PA linearizer 1010 may be included, at least in part, with the transceiver 1035.

The memory 1015 may include RAM and ROM. The memory 1015 may also store computer-readable, computer-executable software code 1020 containing instructions that are configured to, when executed, cause the processor 1005 to perform various functions described herein (e.g., adaptive FF linearization methods using adaptive filters, selecting coverage enhancement techniques, call processing, database management, message routing, etc.). Alternatively, the software code 1020 may not be directly executable by the processor 1005 but be configured to cause the computer, e.g., when compiled and executed, to perform functions described herein. The processor 1005 may include an intelligent hardware device, e.g., a CPU, a microcontroller, an ASIC, etc. The processor 1005 may include various special purpose processors such as encoders, queue processing modules, base band processors, radio head controllers, digital signal processor (DSPs), and the like.

The base station communications module 1025 may manage communications with other base stations 105. In some cases, a communications management module may include a controller or scheduler for controlling communications with UEs 115 in cooperation with other base stations 105. For example, the base station communications module 1025 may coordinate scheduling for transmissions to UEs 115 for various interference mitigation techniques such as beamforming or joint transmission.

The components of wireless device 600 (of FIG. 6), wireless device 700 (of FIG. 7), and PA linearizer 610, 910, 1010 (of FIGS. 6-10) may, individually or collectively, be implemented with at least one ASIC adapted to perform some or all of the applicable functions in hardware. Alternatively, the functions may be performed by one or more other processing units (or cores), on at least one IC. In other examples, other types of integrated circuits may be used (e.g., Structured/Platform ASICs, a field programmable gate array (FPGA), or another semi-custom IC), which may be programmed in any manner known in the art. The functions of each unit may also be implemented, in whole or in part, with instructions embodied in a memory, formatted to be executed by one or more general or application-specific processors.

Figure 11:
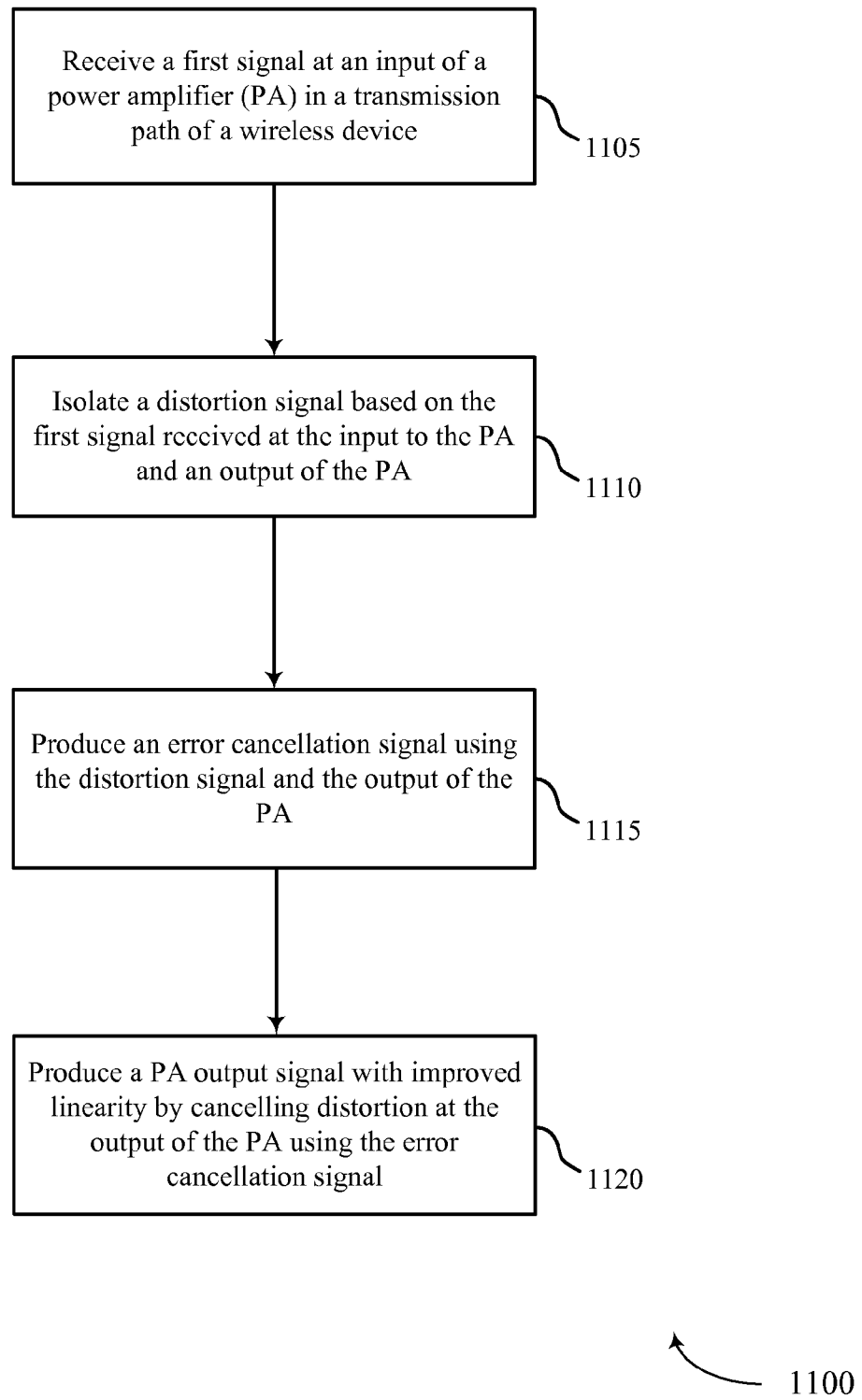
FIGS. 11-14 illustrate methods for adaptive FF linearization methods using adaptive filters in accordance with various aspects of the present disclosure.

FIG. 11 shows a flowchart illustrating a method 1100 for adaptive FF linearization methods using adaptive filters in accordance with various aspects of the present disclosure. The operations of method 1100 may be implemented by a device, such as a UE 115 or base station 105, or its components as described with reference to FIGS. 1-10. For example, the operations of method 1100 may be performed by the PA linearizer 610, 910, 1010 as described with reference to FIGS. 6-10. In some examples, a device may execute a set of codes to control the functional elements of the device to perform the functions described below. Additionally or alternatively, the device may perform aspects the functions described below using special-purpose hardware.

At block 1105, the device may receive a first signal at an input of a PA in a transmission path of a wireless device as described with reference to FIGS. 2A-5. In certain examples, the operations of block 1105 may be performed by the PA 705 as described with reference to FIG. 7.

At block 1110, the device may isolate a distortion signal based at least in part on the first signal received at the input to the PA and an output of the PA as described with reference to FIGS. 2A-5. In certain examples, the operations of block 1110 may be performed by the signal cancellation circuit 710 as described with reference to FIG. 7.

At block 1115, the device may produce an error cancellation signal using the distortion signal and the output of the PA as described with reference to FIGS. 2A-5. In certain examples, the operations of block 1115 may be performed by the error cancellation circuit 715 as described with reference to FIG. 7.

At block 1120, the device may produce a PA output signal with improved linearity by cancelling distortion at the output of the PA using the error cancellation signal as described with reference to FIGS. 2A-5. In certain examples, the operations of block 1120 may be performed by the error cancellation circuit 715 as described with reference to FIG. 7.

Figure 12:
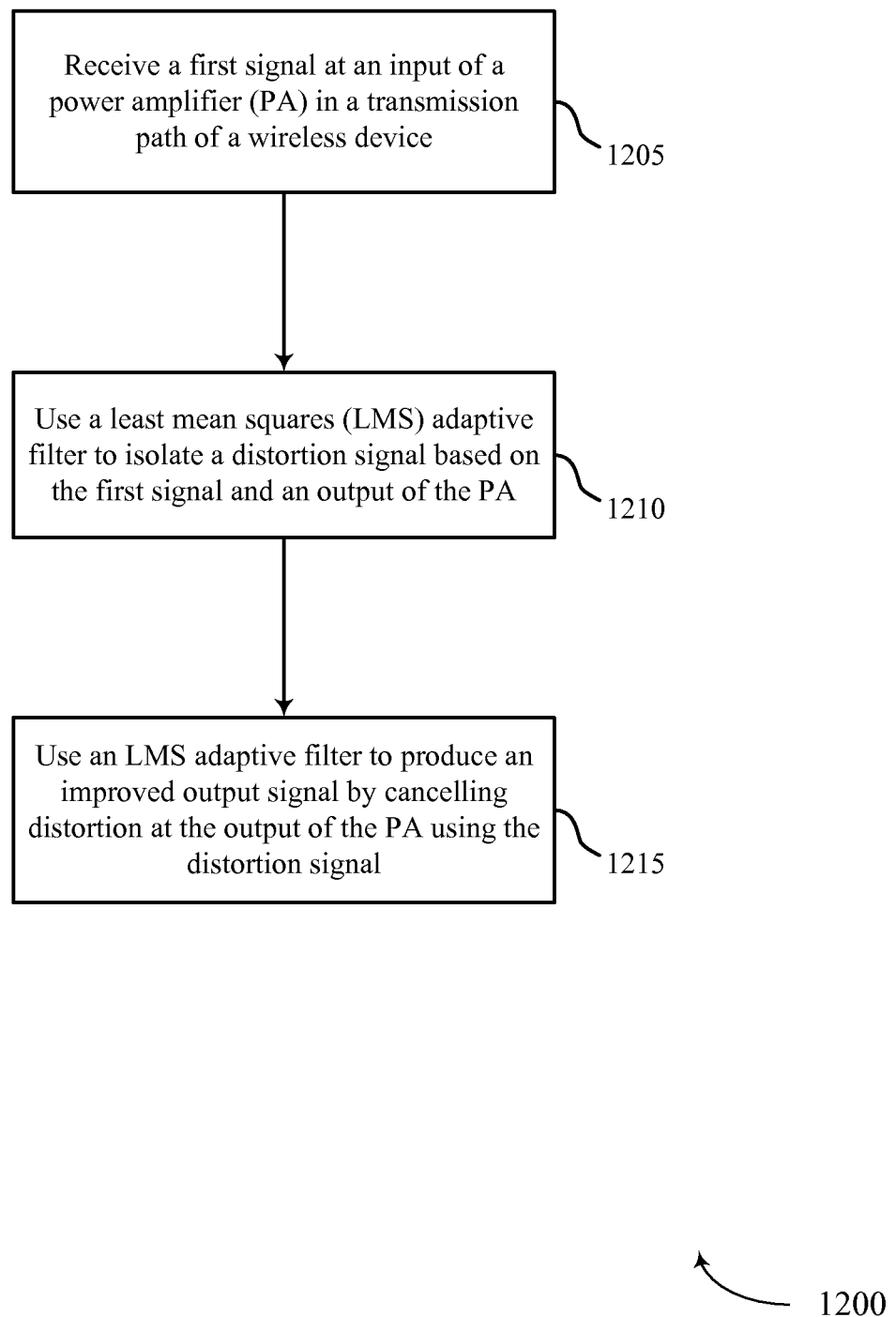

FIG. 12 shows a flowchart illustrating a method 1200 for adaptive FF linearization methods using adaptive filters in accordance with various aspects of the present disclosure. The operations of method 1200 may be implemented by a device, such as a UE 115 or base station 105, or its components as described with reference to FIGS. 1-10. For example, the operations of method 1200 may be performed by the PA linearizer 610, 910, 1010 as described with reference to FIGS. 6-10. In some examples, a device may execute a set of codes to control the functional elements of the device to perform the functions described below. Additionally or alternatively, the device may perform aspects the functions described below using special-purpose hardware. The method 1200 may also incorporate aspects of method 1100 of FIG. 11.

At block 1205, the device may receive a first signal at an input of a PA in a transmission path of a wireless device as described with reference to FIGS. 2A-5. In certain examples, the operations of block 1205 may be performed by the PA 705 as described with reference to FIG. 7.

At block 1210, the device may use an LMS adaptive filter to isolate a distortion signal based at least in part on the first signal and an output of the PA as described with reference to FIGS. 2A-5. In certain examples, the operations of block 1210 may be performed by the signal cancellation circuit 710 as described with reference to FIG. 7.

At block 1215, the device may use an LMS adaptive filter to produce an improved output signal by cancelling distortion at the output of the PA using the distortion signal as described with reference to FIGS. 2A-5. In certain examples, the operations of block 1215 may be performed by the error cancellation circuit 715 as described with reference to FIG. 7.

Figure 13:
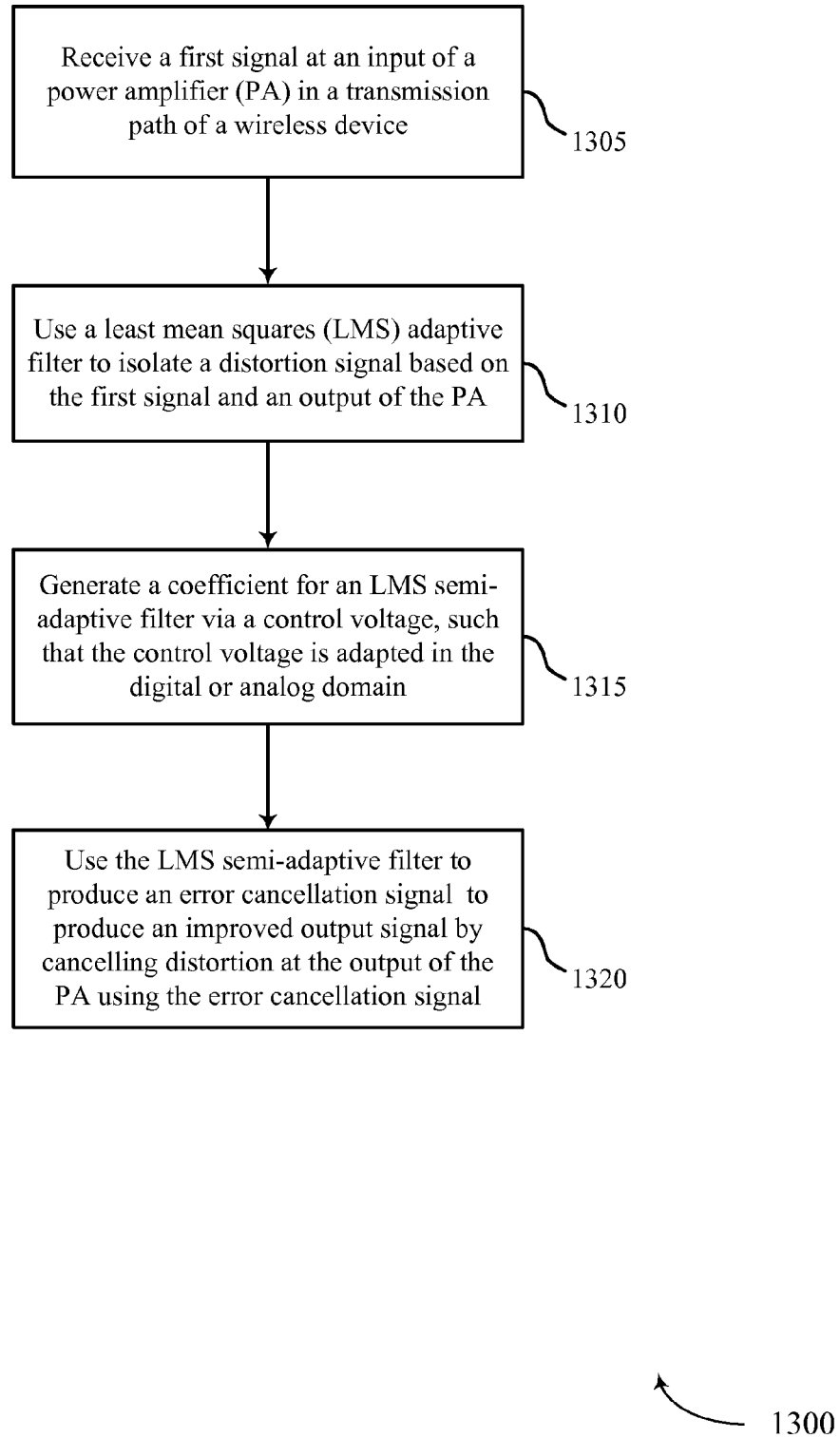

FIG. 13 shows a flowchart illustrating a method 1300 for adaptive FF linearization methods using adaptive filters in accordance with various aspects of the present disclosure. The operations of method 1300 may be implemented by a device, such as a UE 115 or base station 105, or its components as described with reference to FIGS. 1-10. For example, the operations of method 1300 may be performed by the PA linearizer 610, 910, 1010 as described with reference to FIGS. 6-10. In some examples, a device may execute a set of codes to control the functional elements of the device to perform the functions described below. Additionally or alternatively, the device may perform aspects the functions described below using special-purpose hardware. The method 1300 may also incorporate aspects of methods 1100, and 1200 of FIGS. 11, 12.

At block 1305, the device may receive a first signal at an input of a PA in a transmission path of a wireless device as described with reference to FIGS. 2A-5. In certain examples, the operations of block 1305 may be performed by the PA 705 as described with reference to FIG. 7.

At block 1310, the device may use an LMS adaptive filter to isolate a distortion signal based at least in part on the first signal and an output of the PA as described with reference to FIGS. 2A-5. In certain examples, the operations of block 1310 may be performed by the signal cancellation circuit 710 as described with reference to FIG. 7.

At block 1315, the device may generate a coefficient for an LMS semi-adaptive filter via a control voltage, wherein the control voltage may be adapted in the digital or analog domain as described with reference to FIGS. 2A-5. In certain examples, the operations of block 1315 may be performed by the control generator 820 as described with reference to FIG. 8.

At block 1320, the device may use the LMS semi-adaptive filter to produce an improved output signal by cancelling distortion at the output of the PA using the error cancellation signal as described with reference to FIGS. 2A-5. In certain examples, the operations of block 1320 may be performed by the error cancellation circuit 715 as described with reference to FIG. 7.

Figure 14:
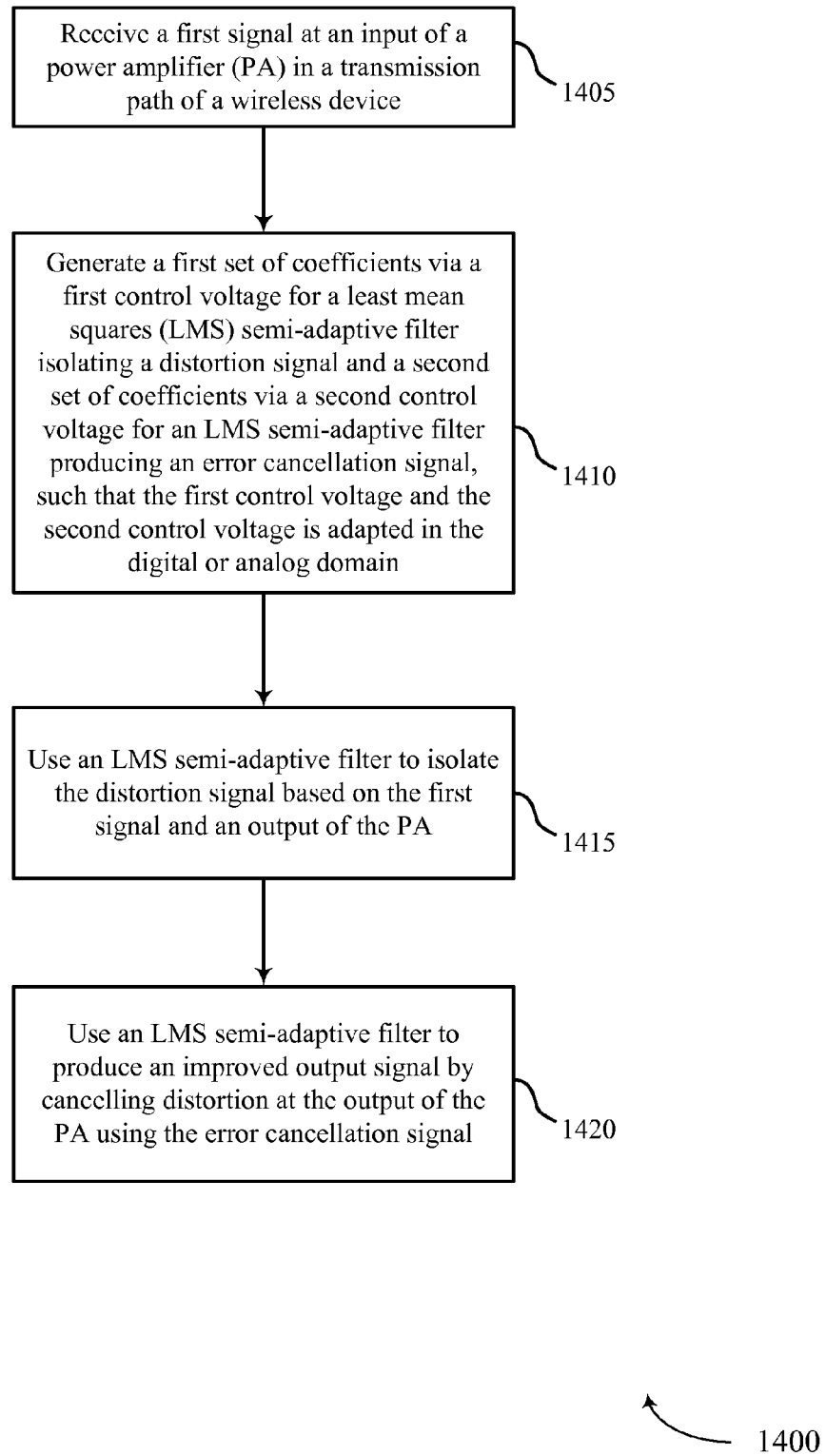

FIG. 14 shows a flowchart illustrating a method 1400 for adaptive FF linearization methods using adaptive filters in accordance with various aspects of the present disclosure. The operations of method 1400 may be implemented by a device, such as a UE 115 or base station 105, or its components as described with reference to FIGS. 1-10. For example, the operations of method 1400 may be performed by the PA linearizer 610, 910, 1010 as described with reference to FIGS. 6-10. In some examples, a device may execute a set of codes to control the functional elements of the device to perform the functions described below. Additionally or alternatively, the device may perform aspects the functions described below using special-purpose hardware. The method 1400 may also incorporate aspects of methods 1100, 1200, and 1300 of FIGS. 11-13.

At block 1405, the device may receive a first signal at an input of a PA in a transmission path of a wireless device as described with reference to FIGS. 2A-5. In certain examples, the operations of block 1405 may be performed by the PA 705 as described with reference to FIG. 7.

At block 1410, the device may generate a first set of coefficients via a first control voltage for an LMS semi-adaptive filter producing a distortion signal and a second set of coefficients via a second control voltage for an LMS semi-adaptive filter producing an error cancellation signal, wherein the first control voltage and the second control voltage may be adapted in the digital or analog domain as described with reference to FIGS. 2A-5. In certain examples, the operations of block 1410 may be performed by the control generator 820 as described with reference to FIG. 8.

At block 1415, the device may use an LMS semi-adaptive filter to produce a distortion signal based at least in part on the first signal and an output of the PA as described with reference to FIGS. 2A-5. In certain examples, the operations of block 1410 may be performed by the signal cancellation circuit 710 as described with reference to FIG. 7.

At block 1420, the device may use an LMS semi-adaptive filter to produce an improved output signal by cancelling distortion at the output of the PA using the error cancellation signal as described with reference to FIGS. 2A-5. In certain examples, the operations of block 1415 may be performed by the error cancellation circuit 715 as described with reference to FIG. 7.

Thus, methods 1100, 1200, 1300, and 1400 may provide for adaptive FF linearization methods using adaptive filters. It should be noted that methods 1100, 1200, 1300, and 1400 describe possible implementation, and that the operations and the steps may be rearranged or otherwise modified such that other implementations are possible. In some examples, aspects from two or more of the methods 1100, 1200, 1300, and 1400 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of UMTS. 3GPP LTE and LTE-A are new releases of UMTS that use E-UTRA. UTRA, E-UTRA, UMTS, LTE, LTE-a, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description herein, however, describes an LTE system for purposes of example, and LTE terminology is used in much of the description above, although the techniques are applicable beyond LTE applications.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of wireless communication, comprising:
receiving a first signal at an input of a power amplifier (PA) in a transmission path of a wireless device;
isolating a distortion signal based at least in part on the first signal received at the input to the PA and an output of the PA;
producing an error cancellation signal using the distortion signal and the output of the PA; and
producing a PA output signal with improved linearity by cancelling distortion at the output of the PA using the error cancellation signal.

2. The method of claim 1, further comprising:
using an analog adaptive filter to isolate the distortion signal and an analog adaptive filter to produce the error cancellation signal.

3. The method of claim 2, further comprising:
autonomously generating a set of coefficients for the analog adaptive filters based at least in part on an output of the analog adaptive filters.

4. The method of claim 1, further comprising:
using an analog adaptive filter to isolate the distortion signal and an analog semi-adaptive filter to produce the error cancellation signal; and
generating a coefficient for the analog semi-adaptive filter via a control voltage, wherein the control voltage may be adapted in a digital domain or an analog domain.

5. The method of claim 4, wherein the control voltage is a direct current (DC) control voltage.

6. The method of claim 4, further comprising:
determining the control voltage based at least in part on a steepest descent algorithm or a sign stochastic approximation.

7. The method of claim 1, further comprising:
using an analog semi-adaptive filter to isolate the distortion signal and an analog adaptive filter to produce the error cancellation signal; and
generating a coefficient for the analog semi-adaptive filter via a control voltage, wherein the control voltage may be adapted in a digital domain or an analog domain.

8. The method of claim 1, further comprising:
using analog semi-adaptive filters to isolate the distortion signal and to produce the error cancellation signal; and
generating a first set of coefficients via a first control voltage for the analog semi-adaptive filter isolating the distortion signal and a second set of coefficients via a second control voltage for the analog semi-adaptive filter producing the error cancellation signal, wherein the first control voltage and the second control voltage may be adapted in a digital domain or an analog domain.

9. The method of claim 1, wherein producing the PA output signal comprises:
amplifying the error cancellation signal to match an amplitude and a phase of the error cancellation signal with the distortion at the output of the PA; and
introducing the amplified error cancellation signal to the output of the PA.

10. The method of claim 1, wherein isolating the distortion signal comprises:
using an analog adaptive filter to isolate the distortion signal based at least in part on the first signal, the output of the PA, and the distortion signal via a signal cancellation circuit.

11. The method of claim 10, wherein the analog adaptive filter is a least mean squares (LMS) adaptive filter.

12. The method of claim 1, wherein producing the error cancellation signal comprises:
using an analog adaptive filter to produce the error cancellation signal based at least in part on the output of the PA, the distortion signal, and the improved PA output signal via an error cancellation circuit.

13. The method of claim 1, further comprising:
providing the distortion signal to an injection point at the wireless device.

14. The method of claim 13, wherein the injection point comprises any of:
a receiver at the wireless device;
another PA at the wireless device; or
any combination thereof.

15. The method of claim 1, further comprising:
measuring an amount of distortion associated with the distortion signal; and
bypassing, based at least in part on the measured amount of distortion, at least one of isolating the distortion signal or producing the error cancellation signal.

16. The method of claim 15, wherein bypassing comprises applying a control voltage that has a net voltage of zero to at least one analog semi-adaptive filter.

17. An apparatus for wireless communication, comprising:
a power amplifier (PA) in a transmission path of a wireless device, the PA having a first signal as an input;
a signal cancellation circuit configured to isolate a distortion signal based at least in part on the first signal and an output of the PA; and
an error cancellation circuit configured to produce an error cancellation signal using the distortion signal and the output of the PA and to produce a PA output signal with improved linearity by cancelling distortion at the output of the PA using the error cancellation signal.

18. The apparatus of claim 17, wherein the signal cancellation circuit and the error cancellation circuit comprise respective analog adaptive filters.

19. The apparatus of claim 18, wherein at least one of the analog adaptive filters is configured to autonomously generate, based on an output of the respective analog adaptive filter, a set of coefficients to be used by the respective analog adaptive filter.

20. The apparatus of claim 17, wherein the error cancellation circuit comprises an analog semi-adaptive filter.

21. The apparatus of claim 20, wherein the analog semi-adaptive filter is controlled via a DC control voltage.

22. The apparatus of claim 17, wherein the signal cancellation circuit comprises an analog semi-adaptive filter.

23. The apparatus of claim 17, wherein the signal cancellation circuit comprises an analog semi-adaptive filter, and wherein the error cancellation circuit comprises an analog semi-adaptive filter.

24. The apparatus of claim 17, further comprising:
an amplifier configured to amplify the error cancellation signal; and
a coupling circuit configured to introduce the amplified error cancellation signal to the output of the PA.

25. An apparatus for wireless communication, comprising:
means for receiving a first signal at an input of a power amplifier (PA) in a transmission path of a wireless device;
means for isolating a distortion signal based at least in part on the first signal received at the input to the PA and an output of the PA;
means for producing an error cancellation signal using the distortion signal and the output of the PA; and means for producing a PA output signal with improved linearity by cancelling distortion at the output of the PA using the error cancellation signal.

26. The apparatus of claim 25, further comprising:

means for using an analog adaptive filter to isolate the distortion signal and an analog adaptive filter to produce the error cancellation signal.

27. The apparatus of claim 26, further comprising:

means for autonomously generating a set of coefficients for the analog adaptive filters based at least in part on an output of the analog adaptive filters.

28. The apparatus of claim 25, further comprising:

means for using an analog adaptive filter to isolate the distortion signal and an analog semi-adaptive filter to produce the error cancellation signal for producing the improved PA output signal; and means for generating a coefficient for the analog semi-adaptive filter via a control voltage, wherein the control voltage may be adapted in the digital or analog domain.

29. The apparatus of claim 28, wherein the analog semi-adaptive filter is controlled via a DC control voltage.

30. The apparatus of claim 25, further comprising:

means for using analog semi-adaptive filters to produce the distortion signal and to produce the error cancellation signal; and means for generating a first set of coefficients via a first control voltage for the analog semi-adaptive filter producing the distortion signal and a second set of coefficients via a second control voltage for the analog semi-adaptive filter producing the error cancellation signal, wherein the first control voltage and the second control voltage may be adapted in a digital domain or an analog domain.

* * * * *